(12) United States Patent
Ahn et al.

(10) Patent No.: US 11,548,170 B2
(45) Date of Patent: Jan. 10, 2023

(54) MICRO LED GRIP BODY AND SYSTEM HAVING SAME FOR INSPECTING MICRO LED

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 875 days.

(21) Appl. No.: 16/377,083

(22) Filed: Apr. 5, 2019

(65) Prior Publication Data

US 2019/0308332 A1 Oct. 10, 2019

(30) Foreign Application Priority Data

Apr. 6, 2018 (KR) .................. 10-2018-0040375
Apr. 6, 2018 (KR) .................. 10-2018-0040378
Apr. 20, 2018 (KR) .................. 10-2018-0046025

(51) Int. Cl.
  *B25J 15/06* (2006.01)
  *B65G 47/91* (2006.01)

(52) U.S. Cl.
  CPC .......... *B25J 15/0691* (2013.01); *B65G 47/91* (2013.01)

(58) Field of Classification Search
  CPC .............................. B25J 15/0691; B65G 47/91
  See application file for complete search history.

(56) References Cited

U.S. PATENT DOCUMENTS

| 5,259,957 A | * | 11/1993 | Rosenfeld | .............. C25D 11/04 |
| | | | | 427/245 |
| 6,510,977 B1 | * | 1/2003 | Hertz | .................. H05K 3/3478 |
| | | | | 228/41 |
| 10,707,394 B2 | * | 7/2020 | Ahn | ....................... H01L 24/83 |
| 2012/0313332 A1 | | 12/2012 | Jeon | |
| 2019/0066571 A1 | * | 2/2019 | Goward | .............. G09G 3/3233 |

FOREIGN PATENT DOCUMENTS

| JP | 2007-42684 A | 2/2007 |
| JP | 2011-49291 A | 3/2011 |
| JP | 2016-92240 A | 5/2016 |
| KR | 2002-0092219 A | 12/2002 |
| KR | 100731673 | 6/2007 |
| KR | 10-2012-0137859 A | 12/2012 |
| KR | 10-1305078 B1 | 9/2013 |
| KR | 20140112486 | 9/2014 |
| KR | 10-2015-0101867 A | 9/2015 |
| KR | 20170019415 | 2/2017 |

(Continued)

OTHER PUBLICATIONS

The Office Action for Taiwanese Patent Application No. 108111792, dated Nov. 14, 2022.

*Primary Examiner* — Lynn E Schwenning

(57) ABSTRACT

The present invention relates to a micro LED grip body and a system having the same for inspecting a micro LED, the micro LED grip body having a vacuum-suction structure capable of being used for transferring a micro LED, thereby solving problems of micro LED transfer heads that have been proposed in the related art.

8 Claims, 23 Drawing Sheets

(56) References Cited

FOREIGN PATENT DOCUMENTS

| | | |
|---|---|---|
| KR | 20170024906 | 3/2017 |
| KR | 20170026959 | 3/2017 |
| KR | 101754528 | 7/2017 |
| KR | 101757404 | 7/2017 |
| TW | 201327910 A1 | 7/2013 |
| TW | 201330320 A1 | 7/2013 |

\* cited by examiner

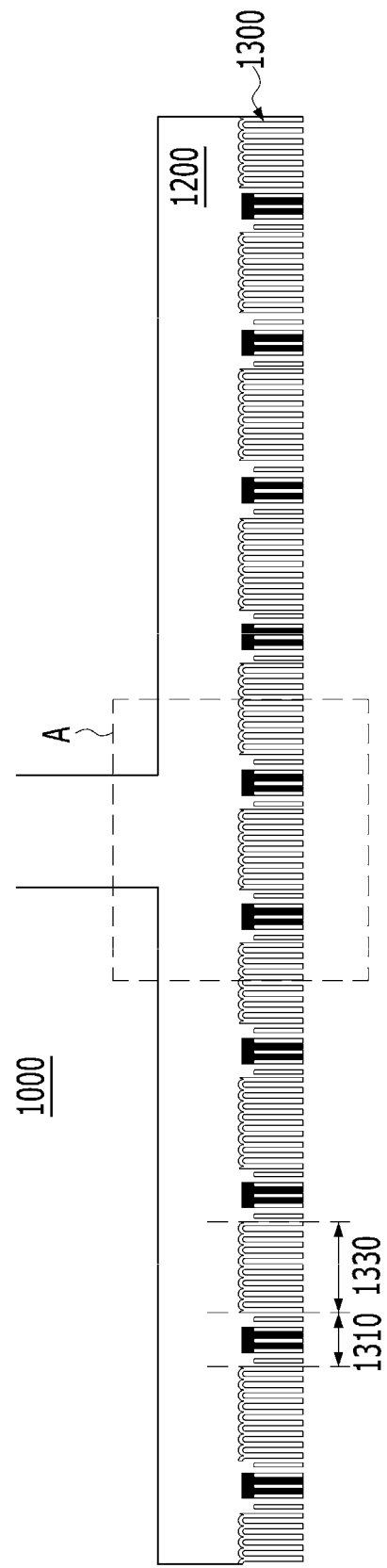

FIG. 20
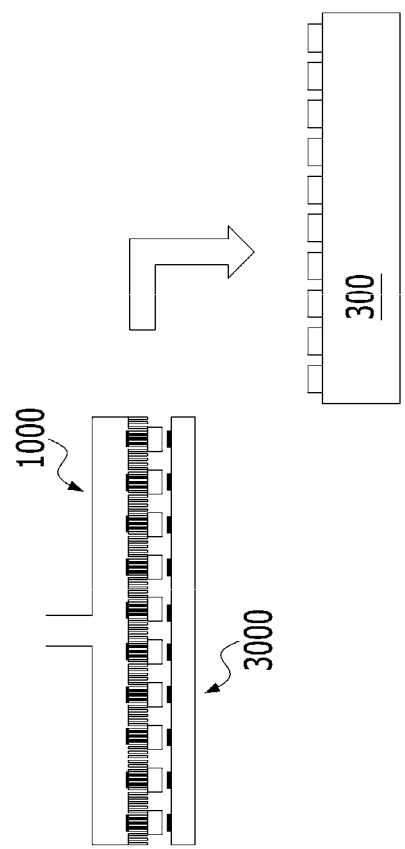
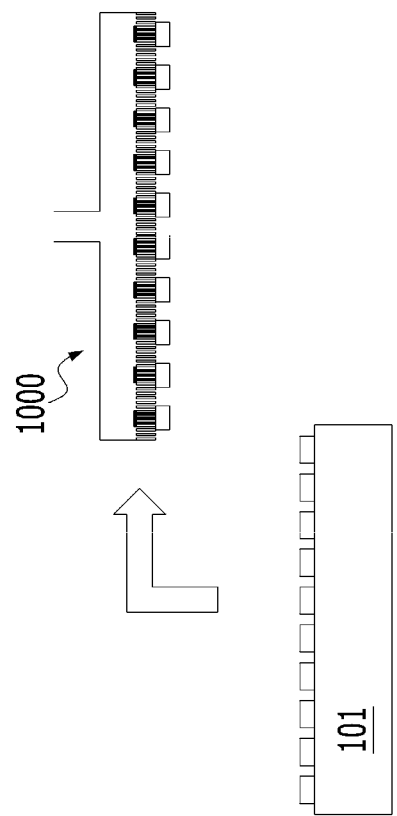

MICRO LED GRIP BODY AND SYSTEM HAVING SAME FOR INSPECTING MICRO LED

CROSS REFERENCE TO RELATED APPLICATION

The present application claims priority to Korean Patent Applications Nos. 10-2018-0040375 and 10-2018-0040378, filed Apr. 6, 2018, and No. 10-2018-0046025 filed Apr. 20, 2018, the entire contents of which is incorporated herein for all purposes by this reference.

BACKGROUND OF THE INVENTION

Field of the Invention

The present invention relates to a micro LED grip body and a system having the same for inspecting a micro LED.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply the micro LED to a display, it is necessary to develop a customized microchip on the basis of a flexible material and/or flexible device using a micro LED device, and techniques of transferring the micrometer-sized LED chip and mounting the LED chip on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no LED damage problem as compared with the above-mentioned electrostatic head case. However, an adhesive force of the elastic transfer head is required to be higher than that of a target substrate in the transfer process to transfer a micro LED stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and the micro LED may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that a process of applying a bonding material to the pick-up heads is required because the bonding material having an adhesive force is required to be applied to bonding surfaces of the multiple pick-up heads to transfer the micro LED.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and an objective of the present invention is to provide a micro LED grip body and a system having the same for inspecting a micro LED, the micro LED grip body having a vacuum-suction structure capable of being used for transferring a micro LED, thereby solving problems of micro LED transfer heads that have been proposed in the related art.

In order to achieve the above objective, there is provided a micro LED grip body, including: a porous member having pores; and a conductive layer provided on a surface of the porous member.

The conductive layer may be configured in a manner not to block the pores.

In addition, a micro LED brought into close contact with a surface of the conductive layer may be gripped by a transfer head due to vacuum applied to the pores.

In addition, the porous member may include an anodic oxide film.

Furthermore, the porous member may include a porous ceramic.

In order to achieve the above objective, there is provided a micro LED grip body, including: a porous member having pores; a vertical conductive portion provided in the pores of the porous member; and a horizontal conductive portion connected with the vertical conductive portion.

In addition, the vertical conductive portion may be provided in a suction region where a micro LED is gripped.

Furthermore, the porous member may be configured as an anodic oxide film formed by anodizing a metal.

As described above, a micro LED grip body according to the present invention vacuum-sucks micro LEDs to be transferred and transfers the micro LEDs from a first substrate to a second substrate by vacuum-suction.

In addition, a micro LED grip body according to the present invention is provided with a conductive layer to remove static electricity generated on micro LEDs.

In addition, a micro LED grip body according to the present invention is provided with a conductive layer whereby it is possible to check whether micro LEDs are defective by using an inspection device having a conductive layer on a surface thereof.

In addition, a micro LED grip body according to the present invention is provided with a grip portion and a conductive portion in a grip area whereby it is possible to check whether micro LEDs are defective while gripping the micro LEDs.

In addition, a micro LED grip body according to the present invention is provided with a conductive portion to suppress the generation of static electricity and remove generated static electricity.

Furthermore, a micro LED grip body according to the present invention effectively removes static electricity that interferes with gripping and detaching of micro LEDs, thereby more efficiently transferring the micro LEDs.

BRIEF DESCRIPTION OF THE DRAWINGS

The above and other objects, features and other advantages of the present invention will be more clearly understood from the following detailed description when taken in conjunction with the accompanying drawings, in which:

FIG. 14 is a view illustrating a micro LED grip body according to a fifth embodiment of the present invention;

FIG. 20 is a view illustrating micro LEDs inspected by a micro LED grip body embodied by a transfer head according to any one of the fifth to seventh embodiments of the present invention.

DETAILED DESCRIPTION OF THE INVENTION

Figure 1:
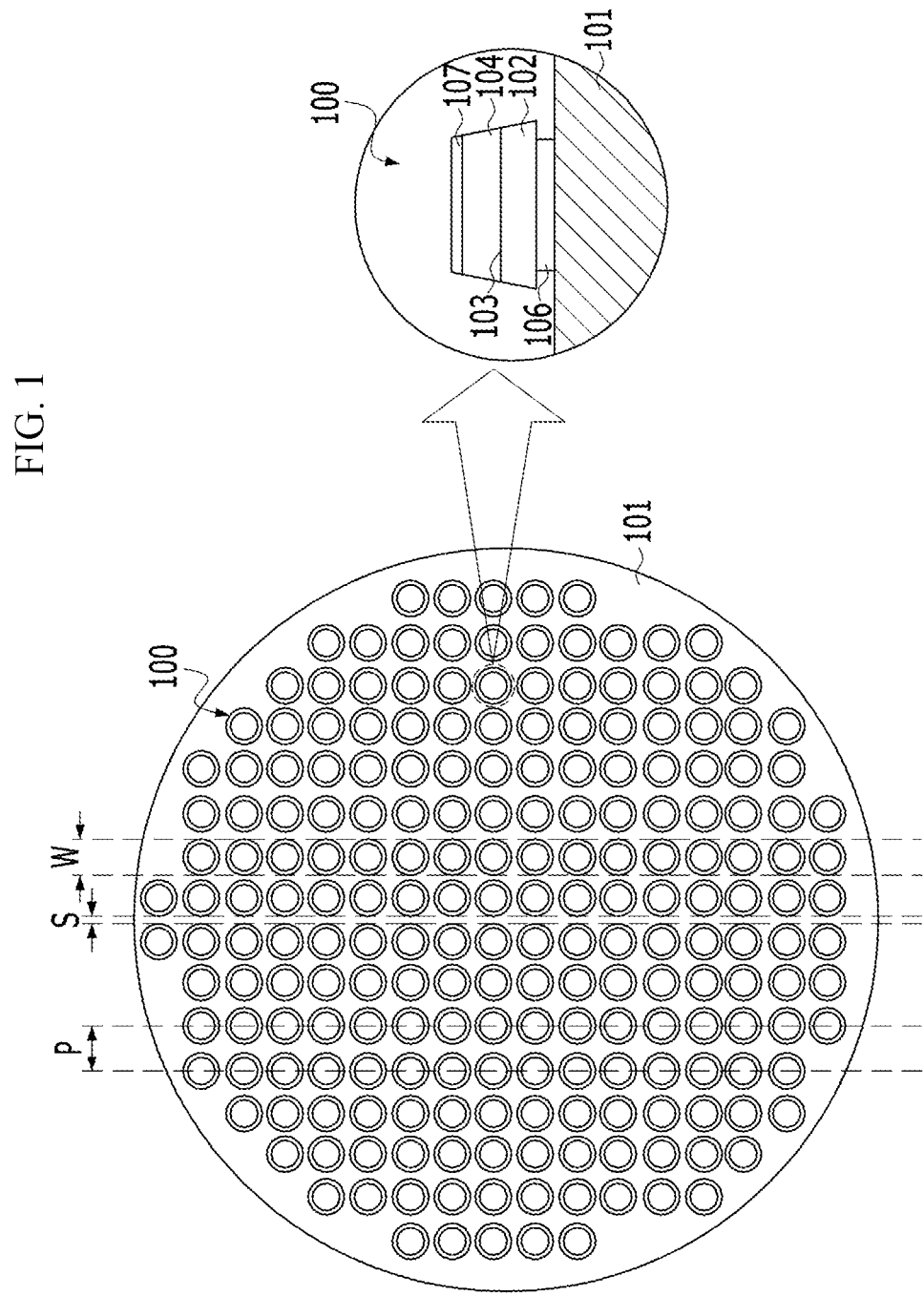
FIG. 1 is a view illustrating micro LEDs to be gripped according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

FIG. 1 is a view illustrating multiple micro LEDs 100 to be gripped by a micro LED grip body according to an embodiment of the present invention. The micro LEDs 100 are fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HYPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
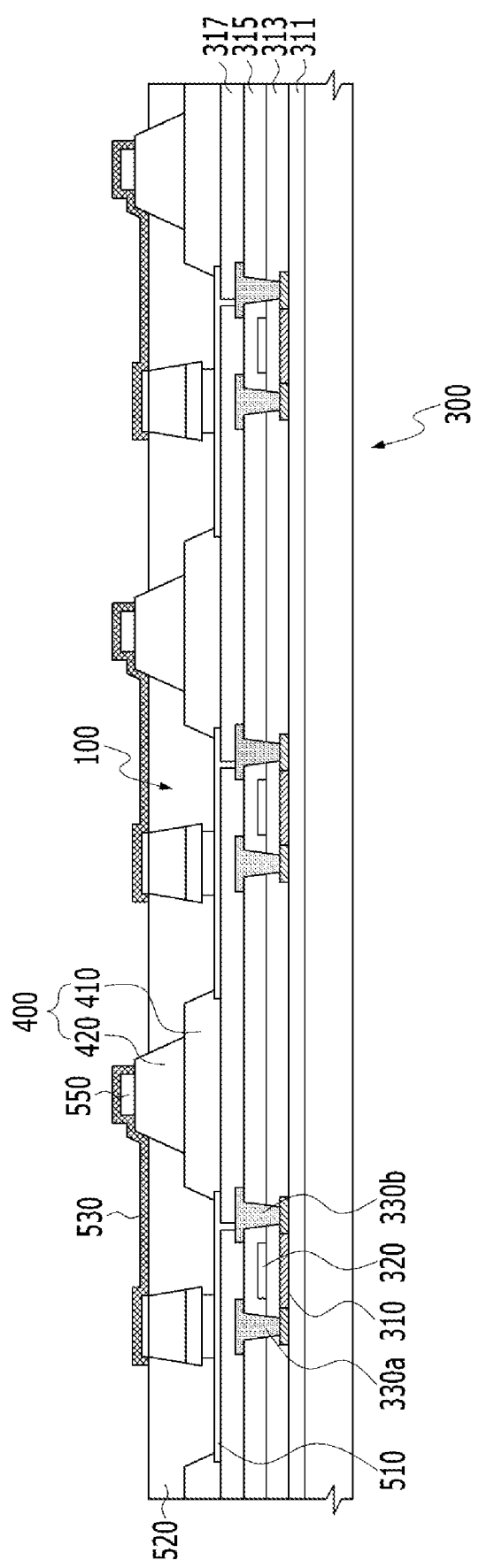
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted to a display substrate by a micro LED grip body according to an embodiment of the present invention.

A display substrate 300 may include various materials. For example, the display substrate 300 may be made of a transparent glass material having $SiO_2$ as a main component. However, materials of the display substrate 300 are not limited to this, and the display substrate 300 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 300, the display substrate 300 is required to be made of a transparent material. However, in the case of a top emission type in which an image is implemented in a direction opposite to the display substrate 300, the display substrate 300 is not required to be made of a transparent material. In this case, the display substrate 300 may be made of metal.

In the case of forming the display substrate 300 using metal, the display substrate 300 may be made of at least one metal selected from among the group consisting of iron, chromium, manganese, nickel, titanium, molybdenum, stainless steel (SUS), Invar, Inconel, and Kovar, but is not limited thereto.

The display substrate 300 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides; poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where the micro LED 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross-sectional shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 300 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin, a thermosetting plastic such as epoxy resin, phenolic resin, urethane resin, acrylic resin, vinyl ester resin, polyimide resin, urea resin, and melamine resin, or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride), or the like. In an alternate embodiment, the first bank layer 410 and the second bank layer 420 may be a distributed Bragg reflector (DBR) having high reflectivity or a mirror reflector made of metal.

The micro LED 100 is disposed in the recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 µm to 100 µm. The micro LEDs 100 are picked up from the growth substrate 101 individually or collectively by a transfer head according to the embodiment of the present invention, transferred to the display substrate 300, and received in the recess of the display substrate 300.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive material such as ITO, IZO, ZnO, and $In_2O_3$.

First Embodiment

Figure 3:
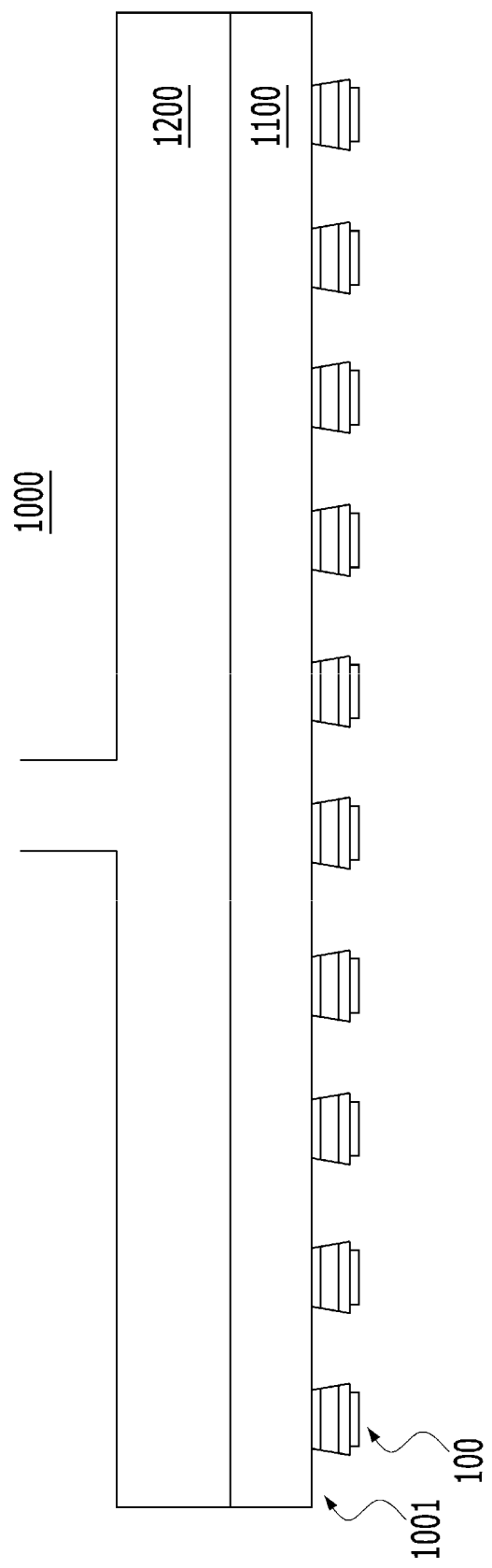
FIG. 3 is a view illustrating a micro LED grip body according to a first embodiment of the present invention.

FIG. 3 is a view illustrating a state in which a micro LED grip body 1000 (hereinafter, referred to as 'vacuum-suction body 1000') according to a first embodiment of the present invention grips the micro LEDs 100 by vacuum-suction. The micro LED grip body 1000 according to the first embodiment of the present invention includes a porous member 1100 having pores and a conductive layer 1001 provided on a surface of the porous member 1100.

The conductive layer 1001 is provided below the porous member 1100. A material of the conductive layer 1001 is not limited as long as the material is an electrically conductive material. The conductive layer 1001 may be formed on the surface of the porous member 1100 by sputter deposition.

The conductive layer 1001 may be provided on an entire lower surface of the porous member 1100 or provided on only a part of the entire lower surface of the porous member 1100. In addition, the conductive layer 1001 may be configured in such a manner as to block the pores formed in the lower surface of the porous member 1100 or not to block the pores of the porous member 1100. In addition, the conductive layer 1001 may be configured by a combination of the configurations.

In the case the micro LEDs 100 are gripped by an electrostatic force, actively inducing static electricity is required. However, in the case the electrostatic force is not used for gripping the micro LEDs 100, the electrostatic force affects gripping of the micro LEDs 100 in a negative way and is thus required to be removed. Static electricity is a negative factor that is required to be removed because the micro LED grip body according to the first embodiment of the present invention grips and detaches the micro LEDs by a suction force using the porous member 1100 having the pores.

Since the conductive layer 1001 is provided on the surface of the porous member 1100, it is possible to prevent the generation of static electricity on the surface of the micro LED grip body 1000. Even when static electricity is generated, it is possible to remove the generated static electricity. Accordingly, it possible to prevent malfunction in gripping and detaching of the micro LEDs 100 using the suction force.

According to the configuration in which the conductive layer 1001 is configured on the surface of the porous member 1100 in such a manner as not to block the pores formed on the surface of the porous member 1100, the conductive layer 1001 is also provided with holes that are provided in a grip surface of the vacuum-suction body 1000 and communicate with the pores of the porous member 1100. Thus, it is possible to grip or detach the micro LEDs 100 by applying a vacuum to the pores of the porous member 1100 or releasing the vacuum applied to the pores.

In addition, the conductive layer 1001 is provided on the grip surface gripping the micro LEDs 100 such that it is possible to inspect the micro LEDs 100 by flowing electricity to the conductive layer 1001 while the micro LEDs 100 are being gripped. Each of the micro LEDs 100 may have electrode terminals (the first and second contact electrodes 106 and 107) on upper and lower surfaces thereof, respectively, or have electrode terminals (the first and second contact electrodes 106 and 107) on one surface thereof. For example, in the case the electrode terminals (the first and second contact electrodes 106 and 107) are provided on one surface of the micro LED 100, the terminals provided on one surface of the micro LED 100 can be individually electrically connected through a patterned structure of the conductive layer 1001, whereby it is possible to check whether the micro LED 100 is defective. Alternatively, in the case the electrode terminals (the first and second contact electrodes 106 and 107) are respectively provided on the upper and lower surfaces of the micro LED 100, it is possible to check whether the micro LED 100 is defective using an inspection device 3000, which is provided individually from the conductive layer 1001 and will be described later.

In addition to the above-described functions of the conductive layer 1001, the conductive layer 1001 may be configured to impart a function to the micro LED grip body 1000 which is required when the micro LED grip body 1000 grips or transfers the micro LEDs 100 or may be configured to remove negative factors when the micro LED grip body 1000 grips or transfers the micro LEDs 100.

The micro LED grip body 1000 according to the first embodiment may be embodied as a transfer head that transfers the micro LEDs from a first substrate (e.g., the growth substrate 101) to a second substrate (e.g., the display substrate 300).

A vacuum chamber 1200 is provided on the porous member 1100. The vacuum chamber 1200 is connected to a vacuum port providing vacuum or releasing the vacuum. The vacuum chamber 1200 functions to apply a vacuum to the multiple pores of the porous member 1100 or release the vacuum applied to the pores according to the operation of the vacuum port. A structure of engaging the vacuum chamber 1200 with the porous member 1100 is not limited as long as the structure is suitable for preventing gas or air from leaking to other parts when applying the vacuum to the porous member 1100 or releasing the applied vacuum.

When gripping the micro LEDs 100 with vacuum-suction, the vacuum applied to the vacuum chamber 1200 is transferred to the multiple pores of the porous member 1100 to generate a vacuum suction force for the micro LEDs 100. When detaching the micro LED 100, the vacuum applied to the vacuum chamber 1200 is released to remove the vacuum from the multiple pores of the porous member 1100 whereby the vacuum suction force to the micro LED 100 is removed.

The porous member 1100 may be composed of a material containing a large number of pores therein, and may be configured as powders, a thin film, a thick film, or a bulk form having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type. The porous member 1100 includes an anodic oxide film in which pores are formed in a predetermined arrangement. The porous member 1100 is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member 1100 have a disordered pore structure, the multiple pores are connected to each other inside the porous member 1100 such that air flow paths are formed which connects upper and lower portions of the porous member 1100. When the pores of the porous member 1100 have a vertical pore structure, the inside of the porous member 1100 is pierced from top to bottom by the vertical pores such that air flow paths are formed.

The porous member 1100 includes a suction region 1310 gripping the micro LEDs 100 and a non-suction region 1330 not gripping the micro LEDs 100. The suction region 1310 is a region where vacuum of the vacuum chamber 1200 is transferred and grips the micro LEDs 100. The non-suction region 1330 is a region where vacuum of the vacuum chamber 1200 is not transferred and thus does not grip the micro LEDs 100.

The non-suction region 1330 may be embodied by forming a shielding portion on at least a part of a surface of the porous member 1100. The shielding portion is formed to close the pores exposed at least on a part of a surface of the porous member 1100. The shielding portion may be formed on at least a part of upper and lower surfaces of the porous member 1100. In particular, in the case where the porous member 1100 has a disordered pore structure, the shielding portion may be formed on both the upper and lower surfaces of the porous member 1100.

The shielding portion is not limited in material, shape, and thickness as long as the shielding portion functions to close the pores exposed to the surface of the porous member 1100. Preferably, the shielding portion may be further provided and made of a photoresist (PR, including dry film PR) or a metal or may be provided by the own structure of the porous member 1100. In the case the shielding portion is provided by the structure of the porous member 1100, for example, in the case the porous member 1100 to be described later is made of an anodic oxide film, the shielding portion may be a barrier layer or a metal base material.

The vacuum-suction body 1000 may be provided with a monitoring unit monitoring the degree of vacuum of the vacuum chamber 1200. The monitoring unit may monitor the degree of vacuum generated in the vacuum chamber 1200, and a control unit may control the degree of vacuum of the vacuum chamber 1200 according to the degree of vacuum of the vacuum chamber 1200. When the monitoring unit monitors that the degree of vacuum of the vacuum chamber 1200 is lower than a predetermined range of the degree of vacuum, the control unit may determine that some of the micro LEDs 100 to be vacuum-sucked on the porous member 1100 are not vacuum-sucked or may determine that there is leakage of the vacuum, and thus instruct the vacuum-suction body 1000 to operate again. As described above, the vacuum-suction body 1000 transfers the micro LEDs 100 without error according to the degree of vacuum in the vacuum chamber 1200.

In addition, the vacuum-suction body 1000 may be provided with a buffer member to buffer the contact between the porous member 1100 and the micro LEDs 100. A material of the buffer member is not limited as long as the buffer member buffers the contact between the porous member 1100 and the micro LED 100 and has an elastic force. The buffer member may be provided between the porous member 1100 and the vacuum chamber 1200, but a position where the buffer member is mounted is not limited thereto. The buffer member may be provided at any position of the vacuum-suction body 1000 as long as the buffer member at a certain position can buffer the contact between the porous member 1100 and the micro LED 100.

Second Embodiment

Hereinafter, a second embodiment of the present invention will be described. It should be noted that the embodiment described below will be described with particular emphasis on characteristic components as compared with the first embodiment, and descriptions of the same or similar components as those of the first embodiment will be omitted.

Figure 4:
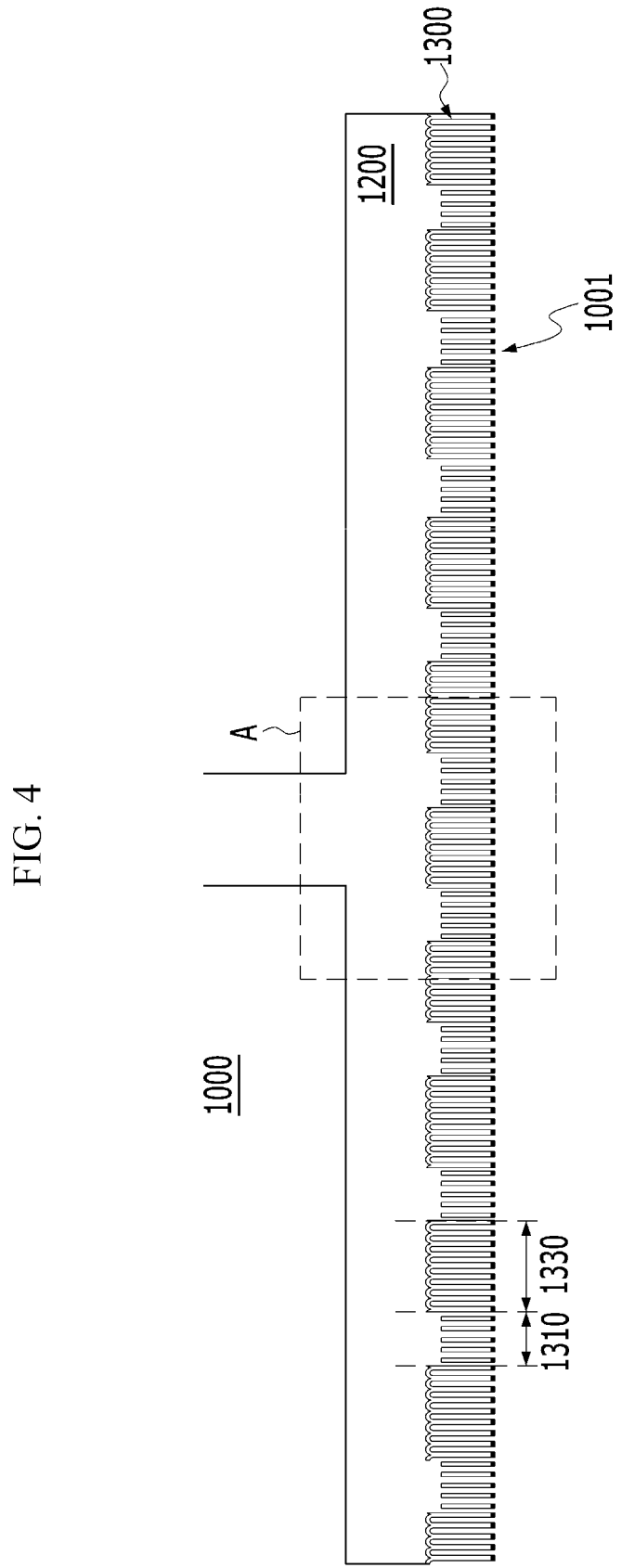
FIG. 4 is a view illustrating a micro LED grip body according to a second embodiment of the present invention.
Figure 5:
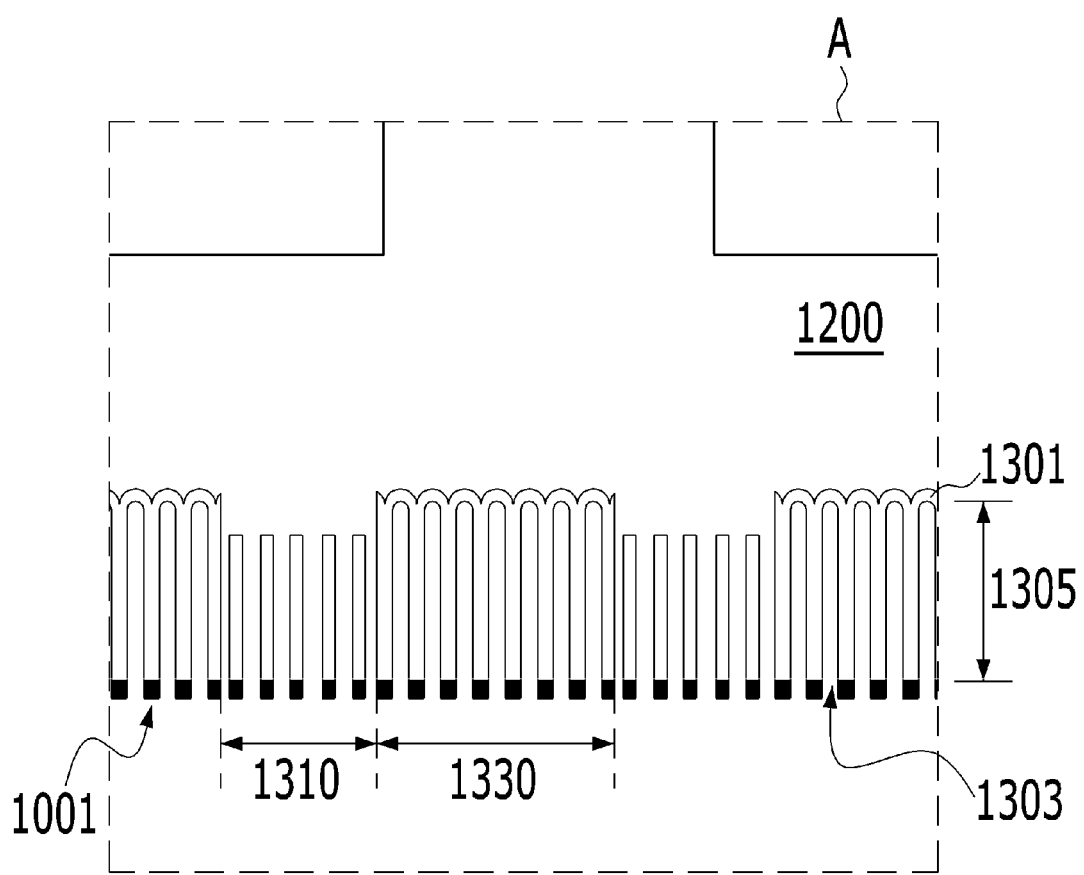
FIG. 5 is an enlarged view of portion 'A' of FIG. 4.
Figure 6:
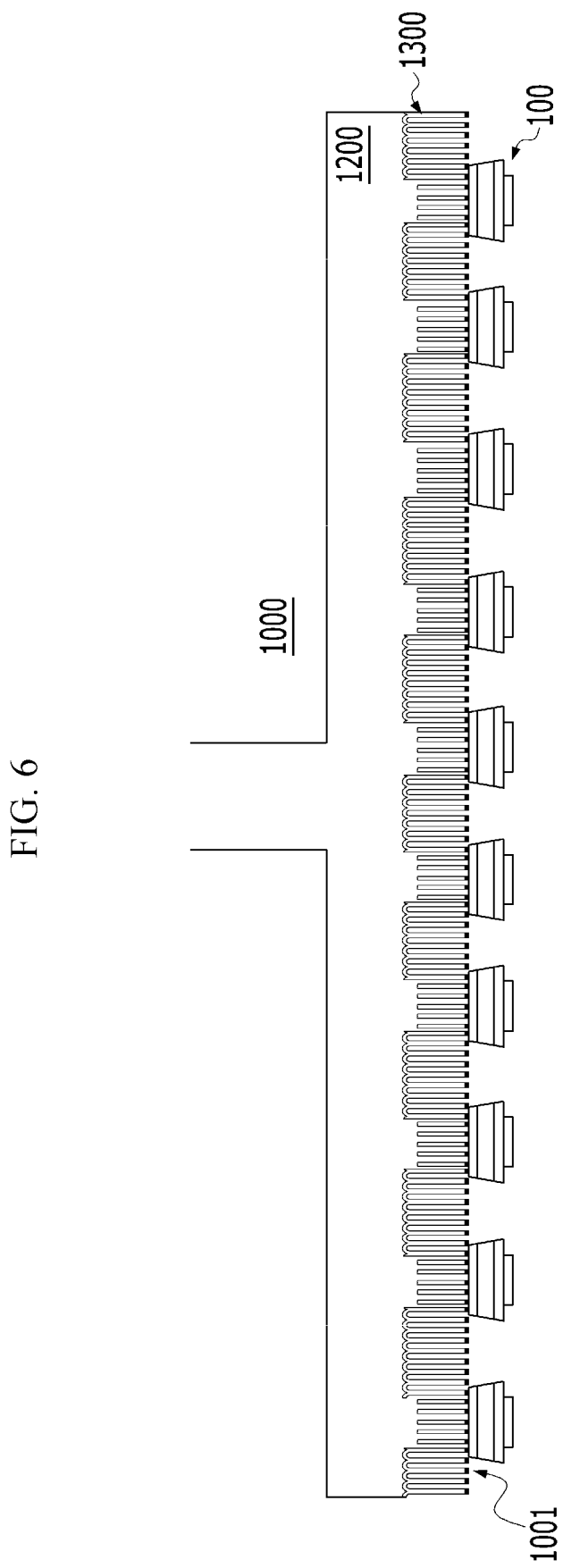
FIG. 6 is a view illustrating a state in which the micro LED grip body of FIG. 4 grips micro LEDs.

FIG. 4 is a view illustrating a micro LED grip body 1000 according to a second embodiment of the present invention; FIG. 5 is an enlarged view of portion 'A' of FIG. 4; and FIG. 6 is a view illustrating a state in which the micro LED grip body 1000 of FIG. 4 grips the micro LEDs 100 by vacuum-suction.

The micro LED grip body 1000 according to the second embodiment is configured to have an anodic oxide film 1300 having pores formed by anodizing a metal.

A conductive layer 1001 is provided below the anodic oxide film 1300. A material of the conductive layer 1001 is not limited as long as the material is an electrically conductive material. The conductive layer 1001 may be formed on the surface of the porous member 1100 by sputter deposition.

The conductive layer 1001 may be provided on an entire lower surface of the anodic oxide film 1300 or provided on only a part of the entire lower surface of the anodic oxide film 1300. In addition, the conductive layer 1001 may be configured in such a manner as to block the pores formed in the lower surface of the anodic oxide film 1300 or not to block the pores of the anodic oxide film 1300. In addition, the conductive layer 1001 may be configured by a combination of the configurations.

In the case the micro LEDs 100 are gripped by an electrostatic force, actively inducing static electricity is required. However, in the case the electrostatic force is not used for gripping the micro LEDs 100, the electrostatic force affects gripping of the micro LEDs 100 in a negative way and is thus required to be removed. Static electricity is a negative factor that is required to be removed because the micro LED grip body according to the second embodiment of the present invention grips and detaches the micro LEDs by a suction force using the anodic oxide film 1300 having the pores.

Since the conductive layer 1001 is provided on the surface of the anodic oxide film 1300, it is possible to prevent the generation of static electricity on the surface of the micro LED grip body 1000. Even when static electricity is generated, it is possible to remove the generated static electricity. Accordingly, it possible to prevent malfunction in gripping and detaching of the micro LEDs 100 using the suction force.

According to the configuration in which the conductive layer 1001 is configured on the surface of the anodic oxide film 1300 in such a manner as not to block the pores formed on the surface of the anodic oxide film 1300, the conductive layer 1001 is also provided with holes that are provided in a grip surface of the vacuum-suction body 1000 and communicate with the pores of the anodic oxide film 1300. Thus, it is possible to grip or detach the micro LEDs 100 by applying vacuum to the pores of the anodic oxide film 1300 or releasing the vacuum applied to the pores.

In addition, the conductive layer 1001 is provided on the grip surface gripping the micro LEDs 100 such that it is possible to inspect the micro LEDs 100 by flowing electricity to the conductive layer 1001 while the micro LEDs 100 are being gripped. Each of the micro LEDs 100 may have electrode terminals (the first and second contact electrodes 106 and 107) on upper and lower surfaces thereof, respectively, or have electrode terminals (the first and second contact electrodes 106 and 107) on one surface thereof. For example, in the case the electrode terminals (the first and second contact electrodes 106 and 107) are provided on one surface of the micro LED 100, the terminals provided on one surface of the micro LED 100 can be individually electrically connected through a patterned structure of the conductive layer 1001, whereby it is possible to check whether the micro LED 100 is defective. Alternatively, in the case the electrode terminals (the first and second contact electrodes 106 and 107) are respectively provided on the upper and lower surfaces of the micro LED 100, it is possible to check whether the micro LED 100 is defective using an inspection device 3000, which is provided individually from the conductive layer 1001 and will be described later.

In addition to the above-described functions of the conductive layer 1001, the conductive layer 1001 may be configured to impart a function to the micro LED grip body 1000 which is required when the micro LED grip body 1000 grips or transfers the micro LEDs 100 or may be configured to remove negative factors when the micro LED grip body 1000 grips or transfers the micro LEDs 100.

The anodic oxide film 1300 is a film formed by anodizing a metal that is a base material, and pores 1303 are pores formed in a process of forming the anodic oxide film 1300 by anodizing the metal. For example, in a case that the base metal is aluminum (Al) or an aluminum alloy, the anodization of the base material forms the anodic oxide film 1300 consisting of anodized aluminum ($Al_2O_3$) on a surface of the base material. The anodic oxide film 1300 formed as described above includes a barrier layer 1301 in which the pores 1303 are not formed and a porous layer 1305 in which the pores 1303 are formed inside. The barrier layer 1301 is positioned on an upper portion of the base material, and the porous layer 1305 is positioned below the barrier layer 1301. After removing the base material on which the anodic oxide film 1300 having the barrier layer 1301 and the porous layer 1305 is formed, only anodic oxide film 1300 consisting of anodized aluminum ($Al_2O_3$) remains.

The anodic oxide film 1300 has the pores 1303 configured vertically and having a regular arrangement with a uniform diameter. Accordingly, after removing the barrier layer 1301, the pores 1303 have a structure extending from top to bottom vertically, thereby facilitating the generation of the vacuum pressure in the vertical direction.

The inside of the anodic oxide film 1300 forms an air flow path vertically by the vertical pores 1303. An internal width of the pores 1303 has a size of several nanometers to several hundred nanometers. For example, when a size of the micro LED to be vacuum-sucked is 30 μm×30 μm and an internal width of the pores 1303 is several nanometers, it is possible to vacuum-suck the micro LEDs 100 by approximately tens of millions of pores 1303. When a size of the micro LED to be vacuum-sucked is 30 μm×30 μm and an internal width of the pores 1303 is several hundred nanometers, it is possible to vacuum-suck the micro LEDs 100 by approximately tens of thousands of pores 1303. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores 1303 formed in the anodic oxide film 1300 by vacuum-suction.

A vacuum chamber 1200 is provided on the anodic oxide film 1300. The vacuum chamber 1200 is connected to a vacuum port providing vacuum pressure. The vacuum chamber 1200 functions to apply a vacuum to the multiple vertical pores of the anodic oxide film 1300 or release the vacuum according to the operation of the vacuum port.

When gripping the micro LEDs 100, the vacuum applied to the vacuum chamber 1200 is transferred to the multiple pores 1303 of the anodic oxide film 1300 to provide a vacuum suction force for the micro LEDs 100. When detaching the micro LEDs 100, the vacuum applied to the vacuum chamber 1200 is released to remove the vacuum from the multiple pores 1303 of the anodic oxide film 1300 whereby the vacuum suction force to the micro LEDs 100 is removed.

The anodic oxide film 1300 includes a suction region 1310 gripping the micro LEDs 100 by vacuum-suction and a non-suction region 1330 not gripping the micro LEDs 100. The suction region 1310 is a region where vacuum of the vacuum chamber 1200 is transferred and grips the micro LEDs 100. The non-suction region 1330 is a region where vacuum of the vacuum chamber 1200 is not transferred and thus does not grip the micro LEDs 100.

Preferably, the suction region 1310 is a region where the pores 1303 extend from top to bottom vertically, and the non-suction region 1330 is a region where at least any one of upper and lower portions of the pores 1303 is closed.

The non-suction region 1330 may be embodied by forming a shielding portion on at least a part of a surface of the anodic oxide film 1300. The shielding portion is formed to close openings of the pores 1303 exposed to at least a part of the surface of the anodic oxide film 1300. The shielding portion may be formed on at least a part of upper and lower surfaces of the anodic oxide film 1300. The shielding portion is not limited in material, shape, and thickness as long as the shielding portion functions to close the openings of the pores 1303 exposed to the surface of the porous member 1100. Preferably, the shielding portion may be further provided and formed of a photoresist (PR, including dry film PR) or a metal, and the barrier layer 1301 may be the shielding portion.

The non-suction region 1330 may be formed such that the barrier layer 1301 formed in the fabrication of the anodic oxide film 1300 closes any one of the upper and lower portions of the vertical pores 1303. The suction region 1310 may be formed such that the barrier layer 1301 is removed by etching or the like so that the upper and lower portions of the vertical pores 1303 extend from top to bottom.

In addition, a thickness of the anodic oxide film 1300 in the suction region 1310 is smaller than a thickness of the anodic oxide film 1300 in the non-suction region 1330 because the pores 1303 extending from top to bottom are formed by removing a part of the barrier layer 1301.

FIG. 5 illustrates that the barrier layer 1301 is provided at an upper portion of the anodic oxide film 1300 and the porous layer 1305 having the pores 1303 is provided at a lower portion thereof. However, the anodic oxide film 1300 illustrated in FIG. 5 may be inverted to form the non-suction region 1330 such that the barrier layer 1301 is provided at the lower portion of the anodic oxide film 1300.

It has been described the non-suction region 1330 is configured such that any one of the upper and lower portions of the pores 1303 is closed by the barrier layer 1301. However, the opposite surface, which is not closed by the barrier layer 1301, may be configured such that an additional coating layer is provided whereby both the upper and lower portions are closed. In forming the non-suction region 1330, the configuration in which both the upper and lower surfaces of the anodic oxide film 1300 are closed is advantageous in that it is possible to reduce the possibility that foreign substances remain in the pores 1303 of the non-suction region 1330 compared with the configuration in which at least one of the upper and lower surfaces of the anodic oxide film 1300 is closed.

Figure 7:
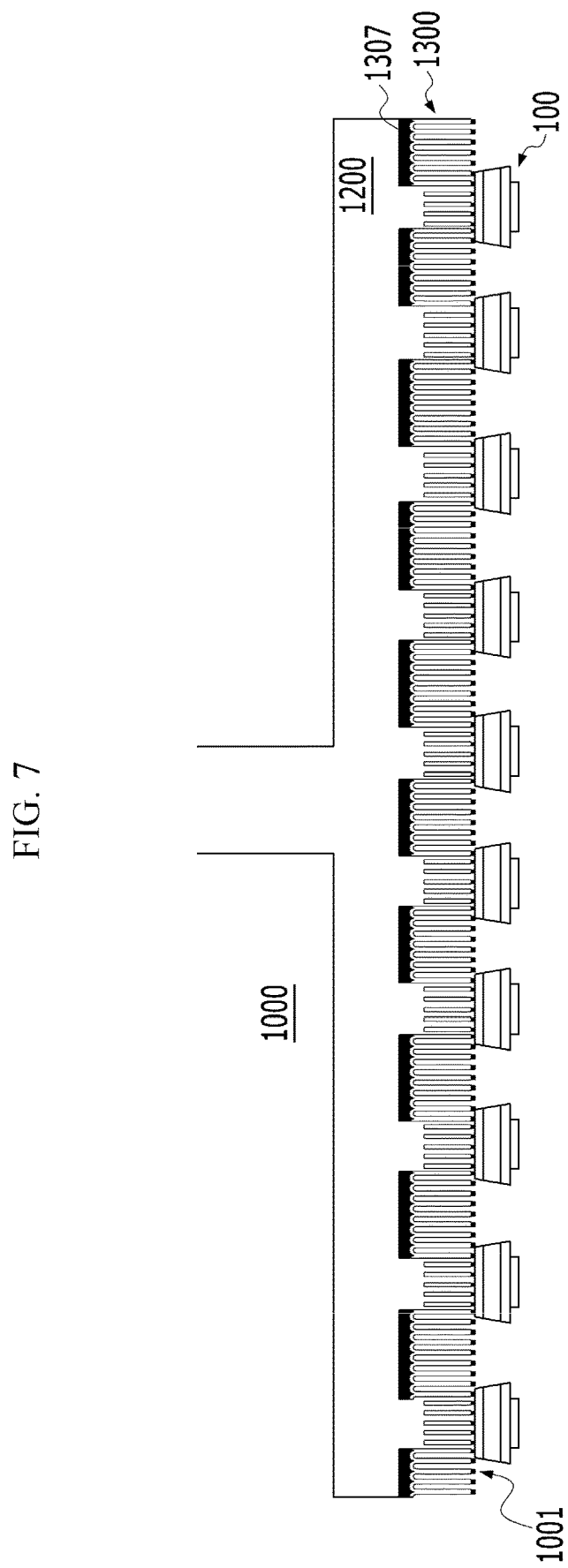
FIGS. 7, 8A, and 8B are views each illustrating a modification of the second embodiment.

FIG. 7 is view illustrating a modification of the micro LED grip body 1000 illustrated in FIG. 6. The micro LED grip body 1000 illustrated in FIG. 7 is configured such that a supporting portion 1307 is further provided on the non-suction region 1330 to reinforce the strength of the anodic oxide film 1300. For example, the supporting portion 1307 may be made of a metal base material. The metal base material used for the anodization is not removed and left on the barrier layer 1301 such that the metal base material (e.g., aluminum or an aluminum alloy) may serve as the supporting portion 1307.

Referring to FIG. 7, the non-suction region 1330 is configured with the supporting portion 1307 made of the metal, the barrier layer 1301, and the porous layer 1305 having the pores 1303. As the supporting portion 1307 made of the metal and the barrier layer 1301 are removed, the suction region 1310 is formed in a manner that the upper and lower portions of the pores 1303 extend from top to bottom. The supporting portion 1307 made of the metal is provided in the non-suction region 1330 to secure the strength of the anodic oxide film 1300. As the strength of the anodic oxide film 1300 which has a relatively weak strength is increased due to the above-described configuration of the supporting portion 1307, it is possible to configure the vacuum-suction body 1000 having the anodic oxide film 1300 to have a large area.

Figure 8A:
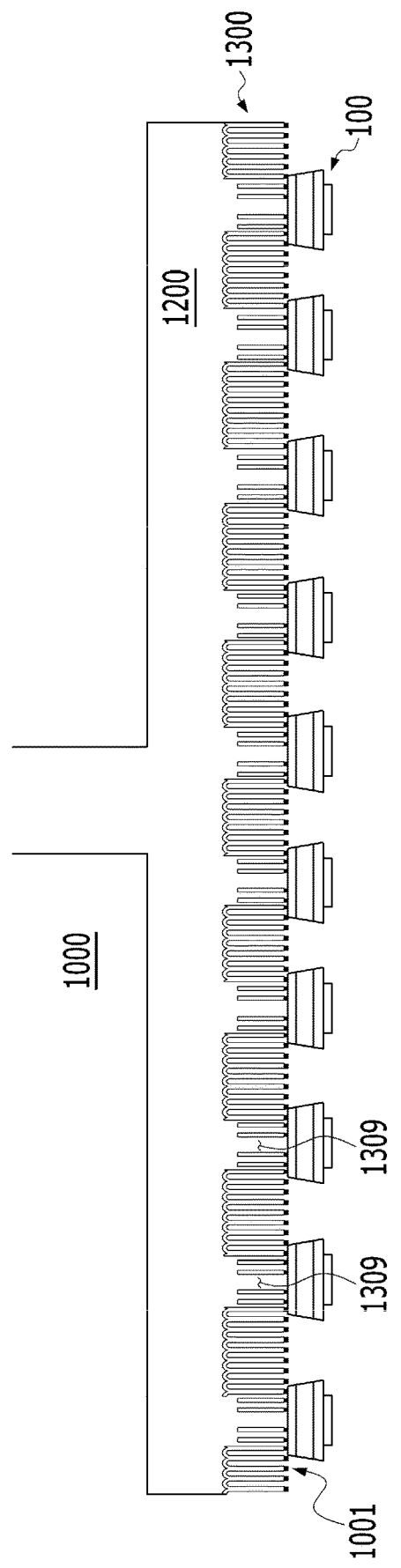

FIG. 8A is a view illustrating a modification of the micro LED grip body 1000 illustrated in FIG. 6. The micro LED grip body 1000 illustrated in FIG. 8A is configured such that a through-hole 1309 is further provided in the suction region 1310 of the anodic oxide film 1300 in addition to the pores 1303 which are formed spontaneously in the anodic oxide film 1300. The through-hole 1309 is configured to extend from top to bottom of the anodic oxide film 1300 longitudinally. A diameter of the through-hole 1309 is configured to be larger than those of the pores 1303. Compared with the configuration in which the micro LEDs 100 are vacuum-sucked only by the pores 1303, it is possible for the modification to increase the grip surface area for the micro LEDs 100 due to the configuration in which the through-hole 1309 having a diameter larger than those of the pores 1303 is provided.

The through-hole 1309 may be formed by etching the anodic oxide film 1300 vertically after forming the anodic oxide film 1300 and the pores 1303. By using the etching method for forming the through-hole 1309, it is possible to form the through-hole 1309 stably compared with simply forming the through-hole 1309 by reaming the pores 1303. In other words, when forming the through-hole 1309 by reaming the pores 1303, side surfaces of the pores 1303 are collapsed, leading to damage to the through-hole 1309, for example, a deformation of the through-hole 1309. However, by forming the through-hole 1309 by etching, the through-hole 1309 is easily formed without damaging the side surfaces of the pores 1303, thereby preventing damage to the through-hole 1309. It is preferable that the through-hole 1309 is configured in the center of the suction region 1310 in order to prevent vacuum leakage in the suction region 1310.

With respect to the entire micro LED grip body 1000, the through-hole 1309 may have different sizes and numbers depending on each position of the suction region 1310. In the case the vacuum port is disposed at the center of the vacuum-suction body 1000, the vacuum pressure is gradually decreased from the center to the edge of the vacuum-suction body 1000, which may cause unevenness of the vacuum pressure among suction regions 1310. In this case, a suction area formed by the through-hole 1309 in the suction region 1310 disposed at the edge side of the vacuum-suction body 1000 may be configured to be larger than a suction area formed by the through-hole 1309 in the suction region 1310 disposed at the center side of the vacuum-suction body 1000. By varying the size of the suction area of the through-hole 1309 according to the position of the suction region 1310, it is possible to eliminate unevenness of the vacuum pressure generated among the suction regions 1310 and to provide a uniform vacuum suction force.

Figure 8B:

FIG. 8B is a view illustrating a modification of the micro LED grip body 1000 illustrated in FIG. 6. The micro LED grip body 1000 illustrated in FIG. 8B is configured such that a suction recess 1309 is further provided in a lower portion of the suction region 1310 of the anodic oxide film 1300. The suction recess 1309 have a horizontal area larger than that of the above-described pores 1303 or the through-hole 1309 of FIG. 8A, but smaller than that of the upper surface of the micro LED 100. Accordingly, it is possible to further increase the vacuum suction region for gripping the micro LEDs 100 and to provide a uniform vacuum suction region for gripping the micro LEDs 100 because of the suction recess 1309. The suction recess 1309 may be formed by etching a part of the anodic oxide film 1300 to a predetermined depth after forming the anodic oxide film 1300 and the pores 1303.

Third Embodiment

Hereinafter, a third embodiment of the present invention will be described. It should be noted that the embodiment described below will be described with particular emphasis on characteristic components as compared with the first embodiment, and descriptions of the same or similar components as those of the first embodiment will be omitted.

Figure 9:
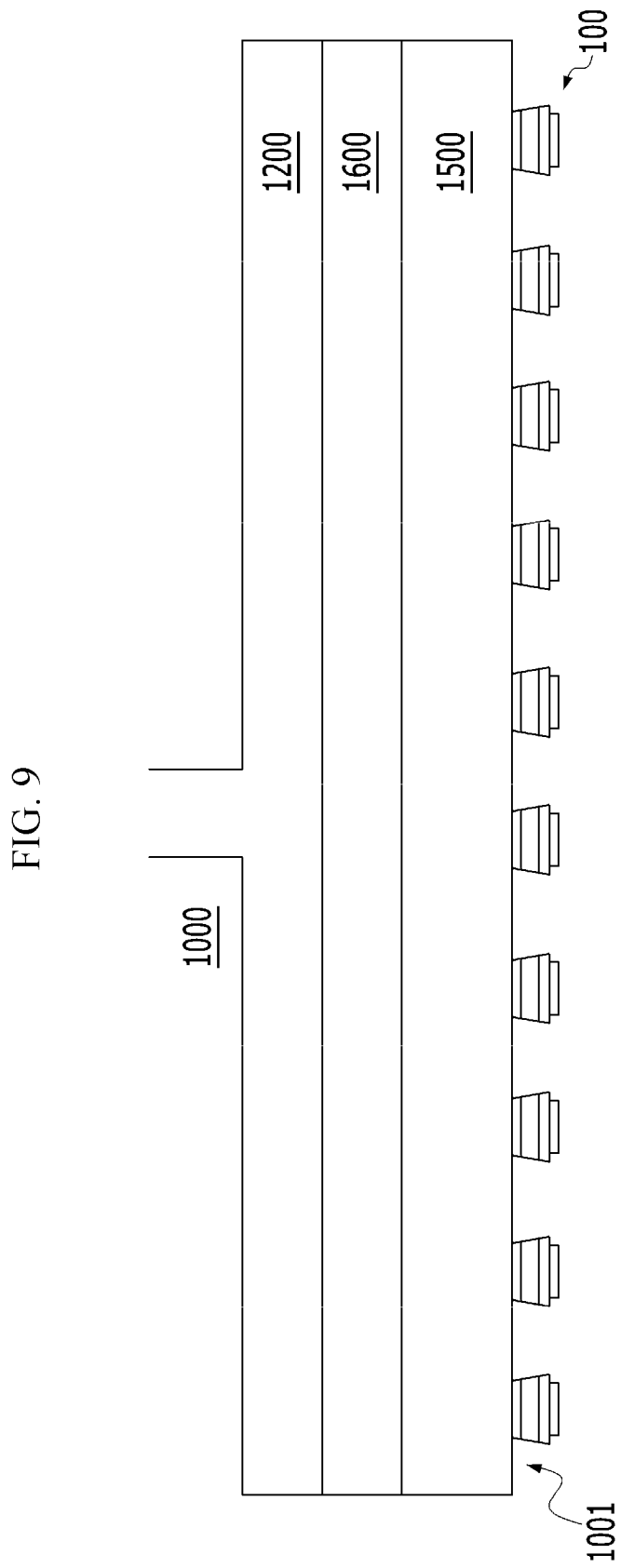
FIG. 9 is a view illustrating a micro LED grip body according to a third embodiment of the present invention.

FIG. 9 is a view illustrating a micro LED grip body 1000 according to a third embodiment of the present invention.

The micro LED grip body 1000 according to the third embodiment is configured to have two porous members including a first porous member 1500 and a second porous member 1600.

A conductive layer 1001 is provided below the first porous member 1500. The conductive layer 1001 formed on a surface of the first porous member 1500 is configured not to block pores formed on a surface of the porous member 1100.

The second porous member 1600 is provided on the first porous member 1500. The first porous member 1500 functions to vacuum-suck the micro LEDs 100. The second porous member 1600 is disposed between a vacuum chamber 1200 and the first porous member 1500 to transfer the vacuum pressure of the vacuum chamber 1200 to the first porous member 1500.

The first and second porous members 1500 and 1600 may have different porosity characteristics. For example, the first and second porous members 1500 and 1600 have different characteristics in the arrangement and size of the pores, the material and the shape of the porous member.

With respect to the arrangement of the pores, one of the first and second porous members 1500 and 1600 may have a uniform arrangement of pores and the other may have a disordered arrangement of pores. With respect to the size of the pores, any one of the first and second porous members 1500 and 1600 may have a larger pore size than the other. Here, the size of the pores may be the average size of the pores or may be the maximum size of the pores. With respect to the material of the porous member, one of the first and second porous members may be formed of one of organic, inorganic (ceramic), metal, and hybrid type porous materials, and the other one may be formed of one of organic, inorganic (ceramic), metal, and or hybrid type porous material different from the first material. In terms of the shape of the porous member, the first and second porous members 1500 and 1600 may have different shapes.

By varying the arrangement, size, material, and shape of the pores of the first and second porous members 1500 and 1600 as described above, the vacuum-suction body 1000 has various functions and each of the first and second porous members 1500 and 1600 performs complementary functions. The number of the porous members is not limited to two as in the case of the first and second porous members. As long as individual porous members have mutually complementary functions, providing two or more porous members also falls into the scope of the third modification.

Figure 10:
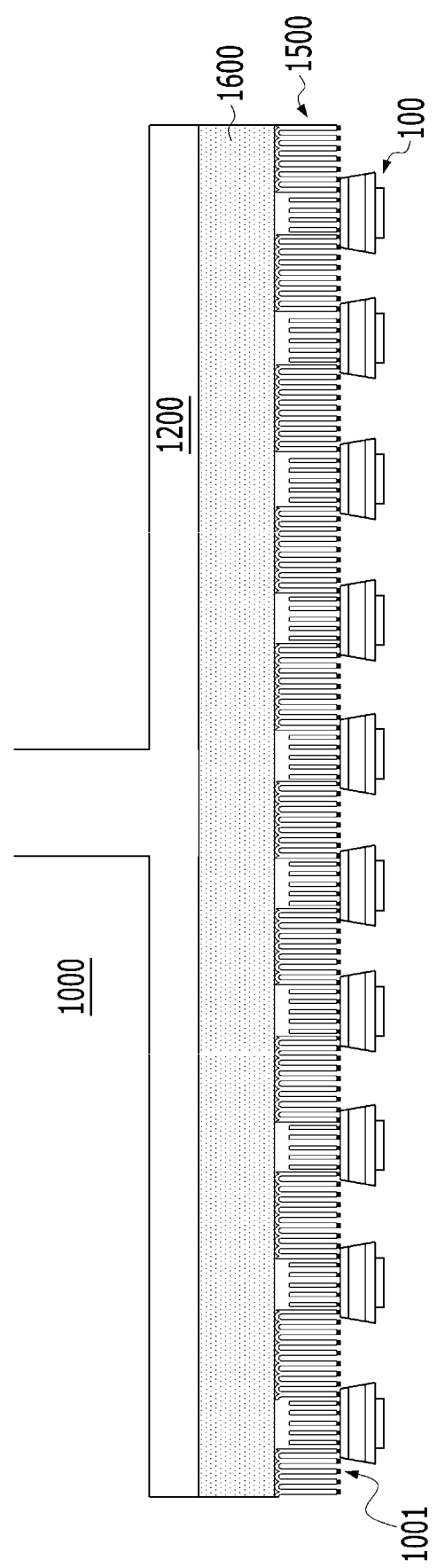
FIG. 10 is a view illustrating a modification of the third embodiment.

Referring to FIG. 10, a first porous member 1500 may be embodied by the configuration of the second embodiment described above and a modification thereof. A conductive layer 1001 is provided below the first porous member 1500. The conductive layer 1001 is configured in a manner to have a predetermined thickness without blocking pores formed in a lower surface of the first porous member 1500.

A second porous member 1600 may be embodied by a porous scaffold functioning to support the first porous member 1500. A material of the second porous member 1600 is not limited as long as the second porous member 1600 made of the material functions to support the first porous member 1500. The second porous member 1600 may have the above-mentioned configuration of the porous member 1100 of the first embodiment. The second porous member 1600 may be embodied by a rigid porous scaffold capable of preventing sagging at the center portion of the first porous member 1500. For example, the second porous member 1600 may be made of a porous ceramic material.

In the case the second porous member 1600 is made of a porous ceramic material, a size of pores is non-uniform and the pores are formed in various directions, so that the vacuum pressure may be supplied non-uniformly depending on the location. On the other hand, pores of an anodic oxide film are uniform in size and the pores are formed in one direction (for example, a vertical direction) such that the vacuum pressure is supplied uniformly even when the location varies. Therefore, as described above, in the case the first porous member 1500 is embodied by the anodic oxide film having pores and the second porous member 1600 is embodied by the porous ceramic material, it is possible to maintain the porosity of the micro LED grip body 1000, secure the strength of the micro LED grip body 1000, and secure the uniformity of the vacuum pressure.

Alternatively, the first porous member 1500 may be embodied by the above-described second embodiment and the modification thereof, and the second porous member 1600 may be embodied by a porous buffer to buffer the contact between the first porous member 1500 and the micro LEDs 100. A material of the second porous member 1600 is not limited as long as the second porous member 1600 made of the material functions to buffer the first porous member 1500. The second porous member 1600 may have the above-mentioned configuration of the porous member 1100 of the first embodiment. The second porous member 1600 may be embodied by a soft porous buffer that helps to protect the micro LEDs 100 from damage, which may occur when the micro LEDs 100 and the first porous member 1500 are brought into contact with each other to grip the micro LEDs 100 by the vacuum-suction. For example, the second porous member 1600 may be embodied by a porous elastic material such as a sponge or the like.

Fourth Embodiment

Hereinafter, a fourth embodiment of the present invention will be described. It should be noted that the embodiment described below will be described with particular emphasis on characteristic components as compared with the first embodiment, and descriptions of the same or similar components as those of the first embodiment will be omitted.

Figure 11:
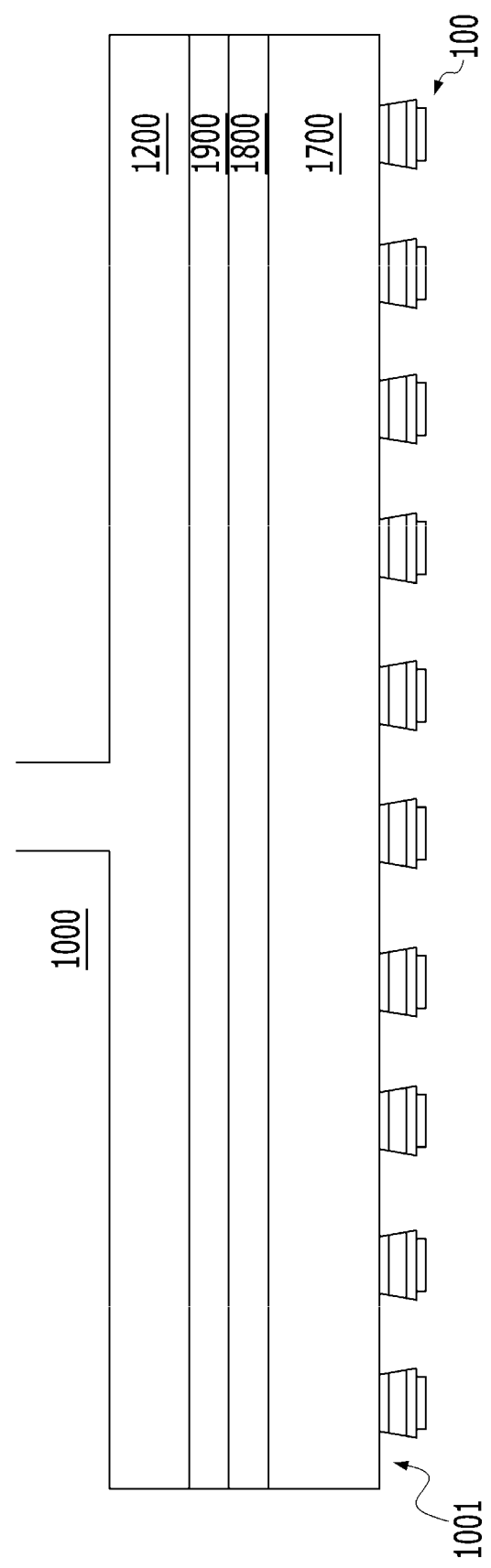
FIG. 11 is a view illustrating a micro LED grip body according to a fourth embodiment of the present invention.

FIG. 11 is a view illustrating a micro LED grip body 1000 according to a fourth embodiment of the present invention.

The micro LED grip body 1000 according to the fourth embodiment is configured to have three porous members including a first porous member 1700, a second porous member 1800, and a third porous member 1900.

A conductive layer 1001 is provided below the first porous member 1500. The conductive layer 1001 is configured in a manner to have a predetermined thickness without blocking pores formed in a lower surface of the first porous member 1500.

The second porous member 1800 is provided on the first porous member 1700, and the third porous member 1900 is provided on the second porous member 1800. The first porous member 1700 functions to vacuum-suck the micro LEDs 100. At least one of the second porous member 1800 and the third porous member 1900 may be embodied by a rigid porous scaffold, and the remaining one of the second porous member 1800 and the third porous member 1900 may be embodied by a soft porous buffer.

The first porous member 1700 may be embodied by the second embodiment and the modification thereof. The second porous member 1800 may be embodied by a rigid porous scaffold (e.g., porous ceramic material) capable of preventing sagging at the center portion of the first porous member 1500. The third porous member 1900 may be embodied by a soft porous buffer (e.g., a porous material having a high elasticity, such as a sponge material).

With the above structure, it is possible to vacuum-suck the micro LEDs 100 uniformly, prevent the sagging at the center portion of the first porous member 1700, and prevent damage to the micro LEDs 100.

A system having a micro LED grip body for inspecting micro LEDs according to an embodiment of the present invention includes: a micro LED grip body including a porous member having pores and a first conductive layer provided on a surface of the porous member; and an inspection device having a second conductive layer on a surface thereof, wherein the micro LEDs are positioned between the first conductive layer of the micro LED grip body and the second conductive layer of the inspection device to inspect the micro LEDs. The first conductive layer is configured in a manner to have a predetermined thickness without blocking pores formed in a lower surface of the porous member.

A system having a micro LED grip body for inspecting micro LEDs according to an embodiment of the present invention will be described with reference to FIGS. 12 and 13.

Figure 12:
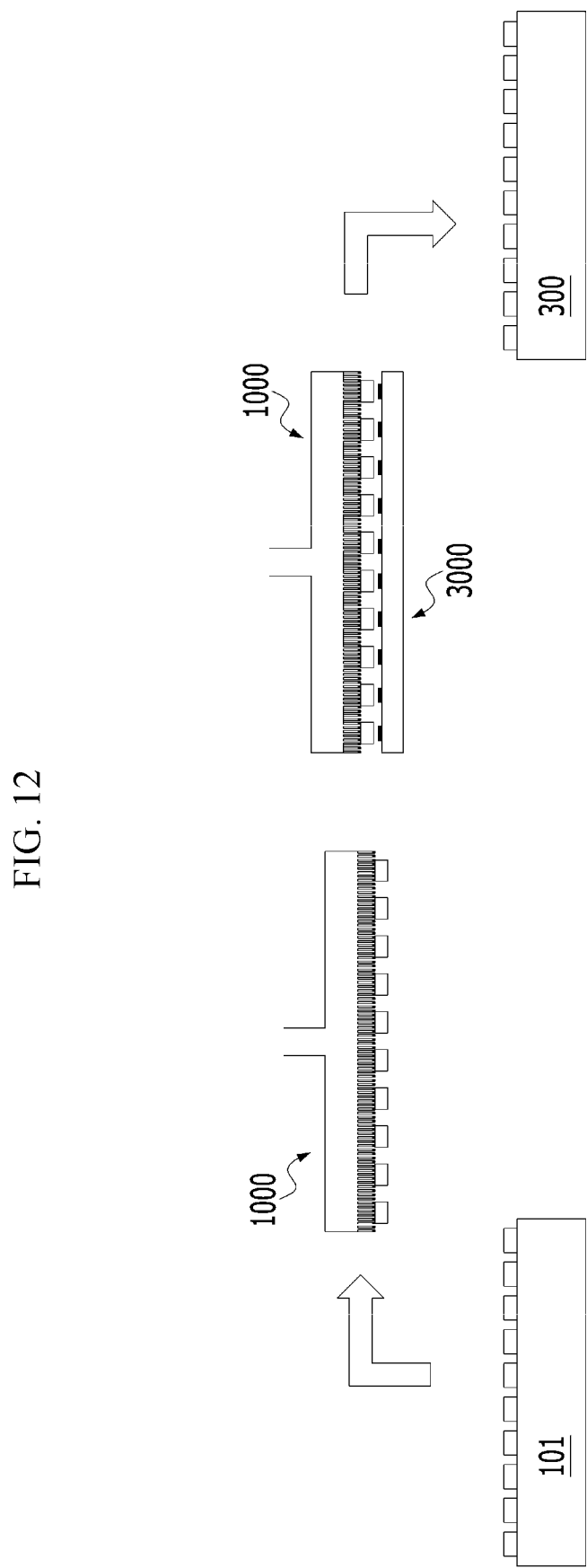
FIG. 12 is a view illustrating micro LEDs inspected by a micro LED grip body embodied by a transfer head according to any one of the first to fourth embodiments of the present invention.

FIG. 12 is a view illustrating the micro LEDs 100 transferred from the first substrate 101 to the second substrate 300 by a micro LED grip body embodied by the vacuum-suction body 1000 according to any one of the first to fourth embodiments of the present invention.

Referring to FIG. 12, the vacuum-suction body 1000 descends to grip the micro LEDs 100 on the first substrate 101 and moves to the second substrate 300. During the movement of the vacuum-suction body 1000, an inspection device 3000 is positioned below the vacuum-suction body 1000. The inspection device 3000 has the second conductive layer on a surface thereof, and the vacuum-suction body 1000 has the first conductive layer on the surface thereof. The first conductive layer is configured on the surface of the porous member in a manner not to block the pores of the porous member of the vacuum-suction body 1000. Thus, when the second conductive layer of the inspection device 3000 and the micro LEDs 100 are brought into contact with each other, it is possible to inspect the micro LEDs 100 by flowing electricity to the terminals (the first and second contact electrodes 106 and 107) provided on the upper and lower sides of the micro LEDs 100. In other words, the micro LEDs 100 are positioned between the first conductive layer of the vacuum-suction body 1000 and the second conductive layer of the inspection device to check whether the micro LEDs 100 are defective.

Figure 13:
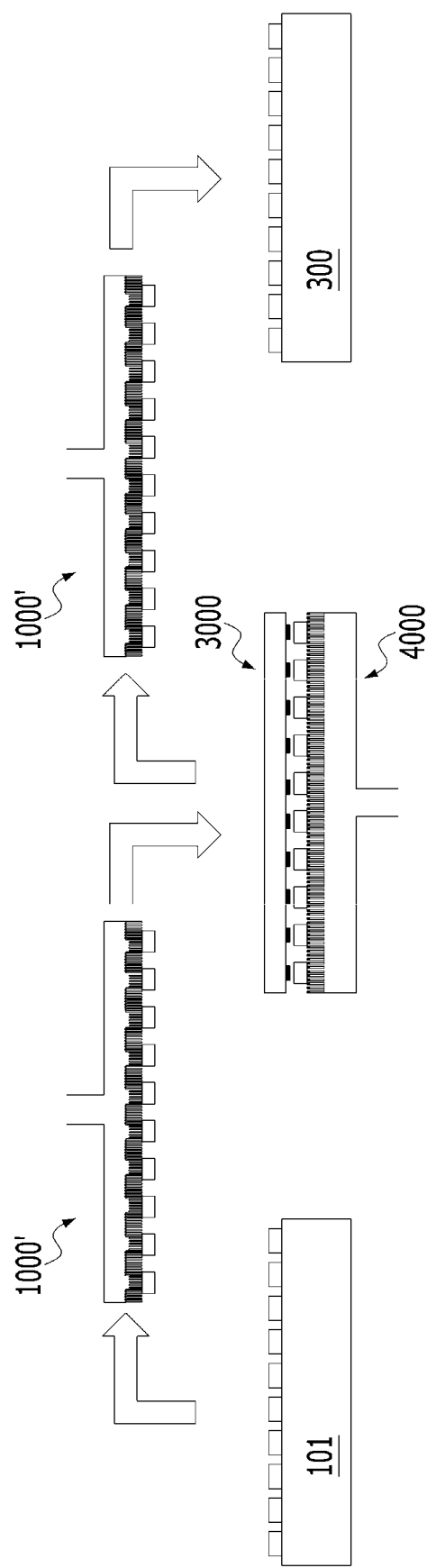
FIG. 13 is a view illustrating micro LEDs inspected by a micro LED grip body embodied by a temporary support substrate according to any one of the first to fourth embodiments of the present invention.

FIG. 13 is a view illustrating the micro LED grip body according to any one of the first to fourth embodiments of the present invention, which is embodied by a temporary support substrate 4000 and receives the micro LEDs 100 from the transfer head 1000'. Here, the transfer head 1000' is a transfer mechanism that grips and transfers the micro LEDs 100 by a grip force, wherein the grip force may include an electrostatic force, an electromagnetic force, a suction force, and the like.

Referring to FIG. 13, the transfer head 1000' grips the micro LEDs 100 on the first substrate 101 and transfers the micro LEDs 100 to the temporary support substrate 4000. The temporary supporting substrate 4000 applies a suction force to the pores to grip the micro LEDs 100. While the temporary support substrate 4000 grips the micro LEDs 100, the inspection device 3000 moves above the temporary support substrate 4000. The inspection device 3000 has a second conductive layer on a surface thereof, and the temporary support substrate 4000 has a first conductive layer on a surface thereof. The first conductive layer is configured on the surface of the porous member in a manner not to block the pores of the porous member of the temporary support substrate 4000. Thus, it is possible to inspect the micro LEDs 100 by flowing electricity to the terminals (the first and second contact electrodes 106 and 107) provided on the upper and lower sides of the micro LEDs 100. In other words, the micro LEDs 100 are positioned between the first conductive layer of the temporary support substrate 4000 and the second conductive layer of the inspection device to check whether the micro LEDs 100 are defective.

Fifth Embodiment

Figure 15A:
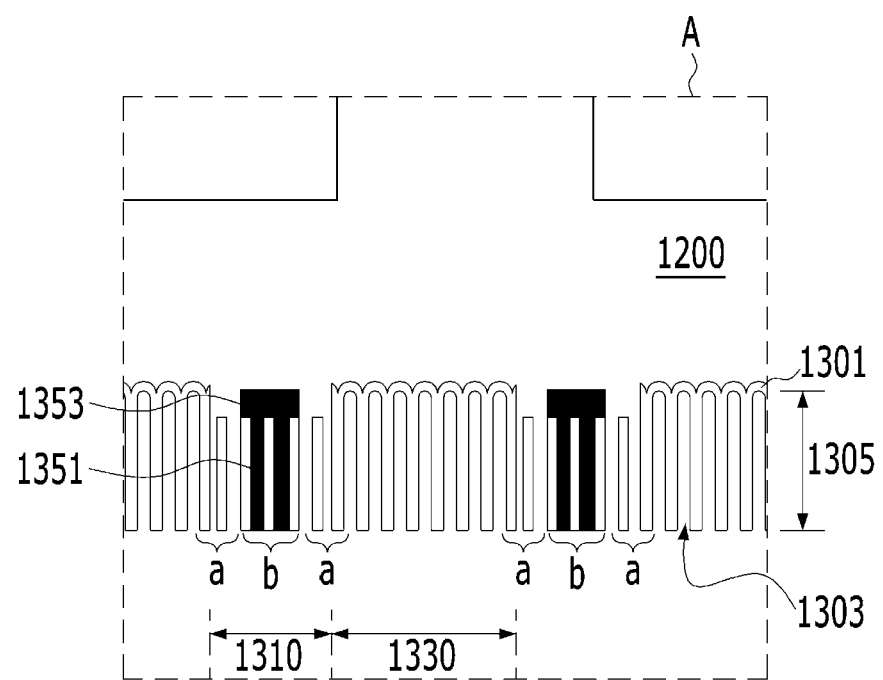
FIG. 15A is an enlarged view of portion 'A' of FIG. 14.
Figure 15B:
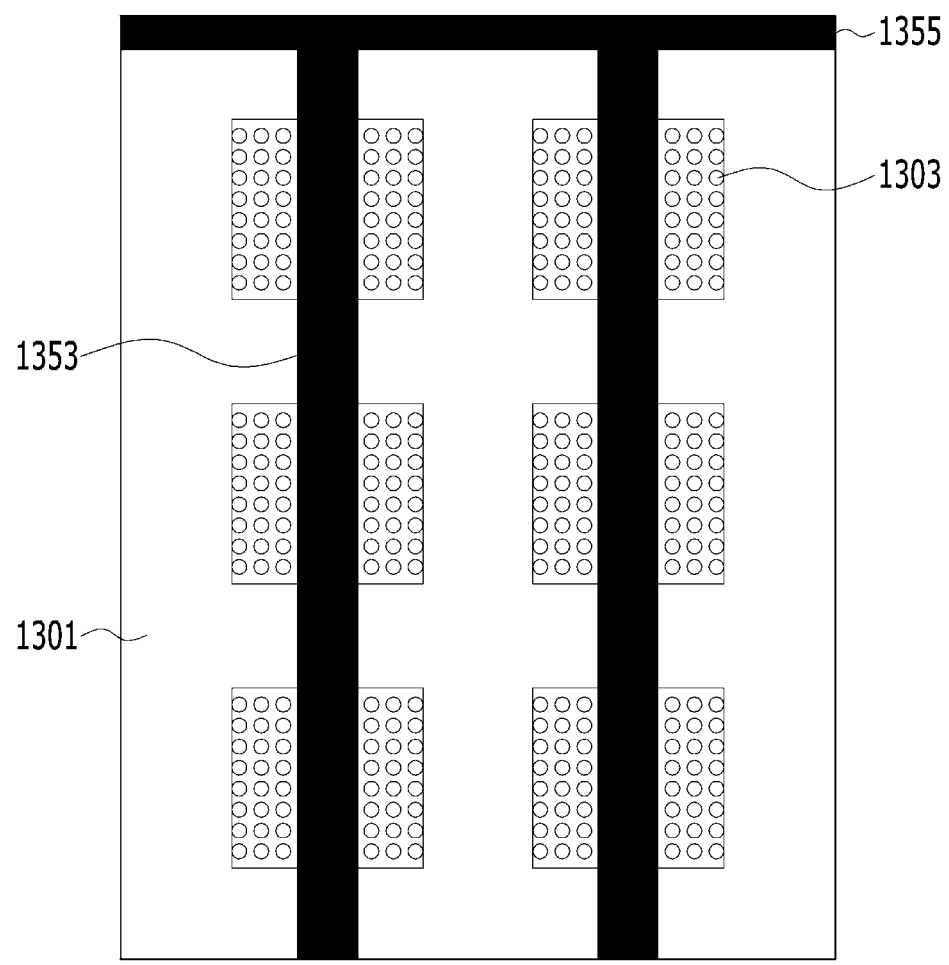
FIG. 15B is a view illustrating the portion 'A' in FIG. 15A viewed from the top of an anodic oxide film.

As illustrated in FIGS. 14, 15A, and 15B, the micro LED grip body 1000 according to a fifth embodiment of the present invention includes: a porous member 1300 having pores, a vertical conductive portion formed in the pores of the porous member; and a horizontal conductive portion connected with the vertical conductive portion.

In the case the micro LEDs 100 are gripped by an electrostatic force, inducing static electricity is required actively. However, in the case the electrostatic force is not used for gripping the micro LEDs 100, the electrostatic force affects gripping of the micro LEDs 100 in a negative way and is thus required to be removed. Static electricity is a negative factor that is required to be removed because the micro LED grip body according to the fifth embodiment of the present invention grips and detaches the micro LEDs by a suction force using the porous member 1300 having the pores.

Due to the configuration of the vertical conductive portion formed in the pores of the porous member and the horizontal conductive portion connected with the vertical conductive portion and exposed to the surface side, it is possible to prevent the generation of static electricity on the surface of the micro LED grip body 1000. Even when static electricity is generated, it is possible to remove the generated static electricity. Accordingly, it possible to prevent malfunction in gripping and detaching of the micro LEDs 100 using the suction force.

The configuration of the vertical conductive portion formed in the pores of the porous member and the horizontal conductive portion connected with the vertical conductive portion and exposed to the surface side may be provided in a suction region 1310 or may be provided in a non-suction region 1330. In the case of the configuration in which the vertical conductive portion and the horizontal conductive portion are provided in the suction region 1310, it is possible to inspect the micro LEDs 100 by flowing electricity to a conductive layer 1001 while the micro LED 100 is being gripped. Each of the micro LEDs 100 may have electrode terminals (the first and second contact electrodes 106 and 107) on upper and lower surfaces thereof, respectively, or have electrode terminals (the first and second contact electrodes 106 and 107) on one surface thereof. For example, in the case the electrode terminals (the first and second contact electrodes 106 and 107) are provided on one surface of the micro LED 100, the terminals provided on one surface of the micro LED 100 can be individually electrically connected through a patterned structure of the conductive layer 1001, whereby it is possible to check whether the micro LED 100 is defective. Alternatively, in the case the electrode terminals (the first and second contact electrodes 106 and 107) are respectively provided on the upper and lower surfaces of the micro LED 100, it is possible to check whether the micro LED 100 is defective using an inspection device 3000, which is provided individually from the conductive layer 1001 and will be described later.

In addition to the above-described functions of the vertical conductive portion and the horizontal conductive portion, the vertical conductive portion and the horizontal conductive portion may be configured to impart a function to the micro LED grip body 1000 which is required when the micro LED grip body 1000 grips or transfers the micro LEDs 100 or may be configured to remove negative factors when the micro LED grip body 1000 grips or transfers the micro LEDs 100.

The micro LED grip body 1000 according to the fifth embodiment may be embodied as a transfer head that transfers the micro LEDs from a first substrate (e.g., the growth substrate 101) to a second substrate (e.g., the display substrate 300). Hereinbelow, an example that the micro LED grip body 1000 according to the fifth embodiment is embodied by a transfer head will be described.

The porous member is provided with a vacuum chamber at an upper portion thereof. The vacuum chamber is connected to a vacuum port providing vacuum or releasing the vacuum pressure. The vacuum chamber functions to apply a vacuum to the multiple pores of the porous member or release the vacuum applied to the pores according to the operation of the vacuum port. A structure of engaging the vacuum chamber with the porous member is not limited as long as the structure is suitable for preventing gas or air from leaking to other parts when applying the vacuum to the porous member or releasing the applied vacuum.

When gripping the micro LEDs 100 with vacuum-suction, the vacuum applied to the vacuum chamber is transferred to the multiple pores of the porous member to generate a vacuum suction force for the micro LEDs 100. When detaching the micro LED 100, the vacuum applied to the vacuum chamber is released to remove the vacuum from the multiple pores of the porous member whereby the vacuum suction force to the micro LED 100 is removed.

The porous member may be composed of a material containing a large number of pores therein, and may be configured as powders, a thin film, a thick film, or a bulk form having a porosity of about 0.2 to 0.95 in a predetermined arrangement or disordered pore structure. The pores of the porous member are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member are classified according to constituent components thereof: organic, inorganic (ceramic), metal, and hybrid type. The porous member includes an anodic oxide film in which pores are formed in a predetermined arrangement. The porous member is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member have a disordered pore structure, the multiple pores are connected to each other inside the porous member such that air flow paths are formed connecting upper and lower portions of the porous member. When the pores of the porous member have a vertical pore structure, the inside of the porous member is pierced from top to bottom by the vertical pores such that air flow paths are formed.

The porous member includes the suction region gripping the micro LEDs 100 and the non-suction region not gripping the micro LEDs 100. The suction region is a region where vacuum of the vacuum chamber is transferred and grips the micro LEDs 100 by vacuum-suction. The non-suction region is a region where vacuum of the vacuum chamber is not transferred and thus does not grip the micro LEDs 100.

The non-suction region may be embodied by forming a shielding portion on at least a part of a surface of the porous member. The shielding portion is formed to close the pores exposed at least on a part of a surface of the porous member. The shielding portion may be formed on at least a part of upper and lower surfaces of the porous member. In particular, in the case where the porous member has a disordered pore structure, the shielding portion may be formed on both the upper and lower surfaces of the porous member.

The shielding portion is not limited in material, shape, and thickness as long as the shielding portion functions to close the pores exposed to the surface of the porous member. Preferably, the shielding portion may be further provided and made of a photoresist (PR, including dry film PR) or a metal or may be provided by the own structure of the porous member. In the case the shielding portion is provided by the structure of the porous member, for example, in the case the porous member to be described later is made of an anodic oxide film, the shielding portion may be a barrier layer or a metal base material.

The vacuum-suction body 1000 may be provided with a monitoring unit monitoring the degree of vacuum of the vacuum chamber. The monitoring unit may monitor the degree of vacuum generated in the vacuum chamber, and a control unit may control the degree of vacuum of the vacuum chamber according to the degree of vacuum of the vacuum chamber. When the monitoring unit monitors that the degree of vacuum of the vacuum chamber is lower than a predetermined range of the degree of vacuum, the control unit may determine that some of the micro LEDs 100 to be vacuum-sucked on the porous member are not vacuum-sucked or may determine that there is leakage of the vacuum, and thus instruct the vacuum-suction body 1000 to operate again. As described above, the vacuum-suction body 1000 transfers the micro LEDs 100 without error according to the degree of vacuum in the vacuum chamber.

In addition, the vacuum-suction body 1000 may be provided with a buffer member to buffer the contact between the porous member and the micro LEDs 100. A material of the buffer member is not limited as long as the buffer member buffers the contact between the porous member and the micro LED 100 and has an elastic force. The buffer member may be provided between the porous member and the vacuum chamber, but a position where the buffer member is mounted is not limited thereto. The buffer member may be provided at any position of the vacuum-suction body 1000 as long as the buffer member at a certain position buffers the contact between the porous member 1100 and the micro LED 100.

Referring to FIGS. 14, 15A, and 15B, the porous member is embodied by an anodic oxide film 1300 having pores formed by anodizing a metal. The anodic oxide film 1300 is a film formed by anodizing a metal that is a base material, and pores 1303 are pores formed in a process of forming the anodic oxide film 1300 by anodizing the metal. For example, in a case that the base metal is aluminum (Al) or an aluminum alloy, the anodization of the base material forms the anodic oxide film 1300 consisting of anodized aluminum ($Al_2O_3$) on a surface of the base material. The anodic oxide film 1300 formed as described above includes a barrier layer 1301 in which the pores 1303 are not formed and a porous layer in which the pores 1303 are formed inside. The barrier layer 1301 is positioned on an upper portion of the base material, and the porous layer is positioned below the barrier layer 1301. After removing the base material on which the anodic oxide film 1300 having the barrier layer 1301 and the porous layer is formed, only anodic oxide film 1300 consisting of anodized aluminum ($Al_2O_3$) remains.

The anodic oxide film 1300 has the pores 1303 configured vertically and having a regular arrangement with a uniform diameter. Accordingly, after removing the barrier layer 1301, the pores 1303 have a structure extending from top to bottom vertically, thereby facilitating the generation of the vacuum pressure in the vertical direction. Referring to FIGS. 14, 15A, and 15B, the anodic oxide film 1300 has a part of the barrier layer 1301 removed, and the pores 1303 in the removed part extend from top to bottom longitudinally.

The inside of the anodic oxide film 1300 forms an air flow path vertically by the vertical pores 1303. An internal width of the pores 1303 has a size of several nanometers to several hundred nanometers. For example, when a size of the micro LED to be vacuum-sucked is 30 μm×30 μm and an internal width of the pores 1303 is several nanometers, it is possible to vacuum-suck the micro LEDs 100 by approximately tens of millions of pores 1303. When a size of the micro LED to be vacuum-sucked is 30 μm×30 μm and an internal width of the pores 1303 is several hundred nanometers, it is possible to vacuum-suck the micro LEDs 100 by approximately tens of thousands of pores 1303. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores 1303 formed in the anodic oxide film 1300 by vacuum-suction.

A vacuum chamber 1200 is provided on the anodic oxide film 1300. The vacuum chamber 1200 is connected to a vacuum port providing vacuum pressure. The vacuum chamber 1200 functions to apply a vacuum to the multiple vertical pores of the anodic oxide film 1300 or release the vacuum according to the operation of the vacuum port.

When gripping the micro LEDs 100, the vacuum applied to the vacuum chamber 1200 is transferred to the multiple pores 1303 of the anodic oxide film 1300 to provide a vacuum suction force for the micro LEDs 100. When detaching the micro LEDs 100, the vacuum applied to the vacuum chamber 1200 is released to remove the vacuum from the multiple pores 1303 of the anodic oxide film 1300 whereby the vacuum suction force to the micro LEDs 100 is removed.

The anodic oxide film 1300 includes a suction region 1310 gripping the micro LEDs 100 by vacuum-suction and a non-suction region 1330 not gripping the micro LEDs 100. The suction region 1310 is a region where vacuum of the vacuum chamber 1200 is transferred and grips the micro LEDs 100. The non-suction region 1330 is a region where vacuum of the vacuum chamber 1200 is not transferred and thus does not grip the micro LEDs 100.

Preferably, the suction region 1310 includes a region where the pores 1303 extend from top to bottom vertically, and the non-suction region 1330 is a region where at least any one of upper and lower portions of the pores 1303 is closed.

The non-suction region 1330 may be embodied by forming a shielding portion on at least a part of a surface of the anodic oxide film 1300. The shielding portion is formed to close openings of the pores 1303 exposed to at least a part of the surface of the anodic oxide film 1300. The shielding portion may be formed on at least a part of upper and lower surfaces of the anodic oxide film 1300. The shielding portion is not limited in material, shape, and thickness as long as the shielding portion functions to close the openings of the pores 1303 exposed to the surface of the anodic oxide film 1300. Preferably, the shielding portion may be further provided and formed of a photoresist (PR, including dry film PR) or a metal, and the barrier layer 1301 may be the shielding portion.

The non-suction region 1330 may be formed such that the barrier layer 1301 formed in the fabrication of the anodic oxide film 1300 closes any one of the upper and lower portions of the vertical pores 1303. The suction region 1310 may be formed such that the barrier layer 1301 is removed by etching or the like so that the upper and lower portions of the vertical pores 1303 extend from top to bottom.

In addition, a thickness of the anodic oxide film 1300 in the suction region 1310 is smaller than a thickness of the anodic oxide film 1300 in the non-suction region 1330 because the pores 1303 extending from top to bottom are formed by removing a part of the barrier layer 1301.

FIGS. 14, 15A, and 15B illustrates that the barrier layer 1301 is provided at an upper portion of the anodic oxide film 1300 and the porous layer 1305 having the pores 1303 is provided at a lower portion thereof. However, the anodic oxide film 1300 illustrated in FIGS. 14, 15A, and 15B may be inverted to form the non-suction region 1330 such that the barrier layer 1301 is provided at the lower portion of the anodic oxide film 1300.

It has been described the non-suction region 1330 is configured such that any one of the upper and lower portions of the pores 1303 is closed by the barrier layer 1301. However, the opposite surface, which is not closed by the barrier layer 1301, may be configured such that an additional coating layer is provided whereby both the upper and lower portions are closed. In forming the non-suction region 1330, the configuration in which both the upper and lower surfaces of the anodic oxide film 1300 are closed is advantageous in that it is possible to reduce the possibility that foreign substances remain in the pores 1303 of the non-suction region 1330 compared with the configuration in which at least one of the upper and lower surfaces of the anodic oxide film 1300 is closed.

Referring to FIGS. 15A and 15B, the suction region 1310 has a structure in which the barrier layer 1301 is removed such that the upper and lower portions of the pores 1303 extend from top to bottom longitudinally.

The suction region 1310 includes a suction portion (a) and a conductive portion (b).

The suction portion (a) is a portion where the pores 1303 extend from top to bottom and a portion gripping the micro LEDs 100, and the conductive portion (b) is a portion composed of a conductive material.

A horizontal conductive portion 1353 is provided on the opposite surface of the grip surface on which the micro LED grip body 1000 grips the micro LEDs 100. The vertical conductive portion 1351 is provided in the suction region 1310 where the micro LEDs 100 are gripped. The vertical conductive portion 1351 is formed by filling the pores 1303 of the anodic oxide film 1300 with the conductive material. One end of the vertical conductive portion 1351 is integrally connected to the horizontal conductive portion 1353 and the opposite end thereof is exposed on the grip surface where the micro LEDs 100 are gripped.

Accordingly, as the suction region 1310 grips the micro LEDs 100, the micro LEDs 100 are brought into contacts with the vertical conductive portion 1351 on the grip surface, whereby it is possible to suppress the generation of static electricity and remove generated static electricity. In addition, it is possible to inspect the micro LEDs 100 while gripping the micro LEDs 100.

FIG. 15B is a view illustrating portion 'A' in FIG. 15A viewed from the top of the anodic oxide film 1300. Referring to FIG. 15B, the open type suction region 1310 is provided and the non-suction region 1330 is provided around the suction region 1310 according to the barrier layer 1301.

Again referring to FIG. 15B, the horizontal conductive portion 1353 is configured to cover only a part of the pores 1303 within the range of the suction region 1310, the pores 1303 extending from top to bottom longitudinally. The pores 1303 not covered with the horizontal conductive portion 1353 function to grip the micro LEDs 100.

In addition, a shared conductive layer 1355 may be provided on a side of the anodic oxide film 1300 to connect individual horizontal conductive portions 1353 each other, the individual horizontal conductive portions 1353 being disposed in parallel. That is, multiple horizontal conductive portions 1353 are connected to one shared conductive layer 1355. The horizontal conductive portions 1353 disposed in parallel may be connected collectively according to the structure of the shared conductive layer 1355.

Figure 16:
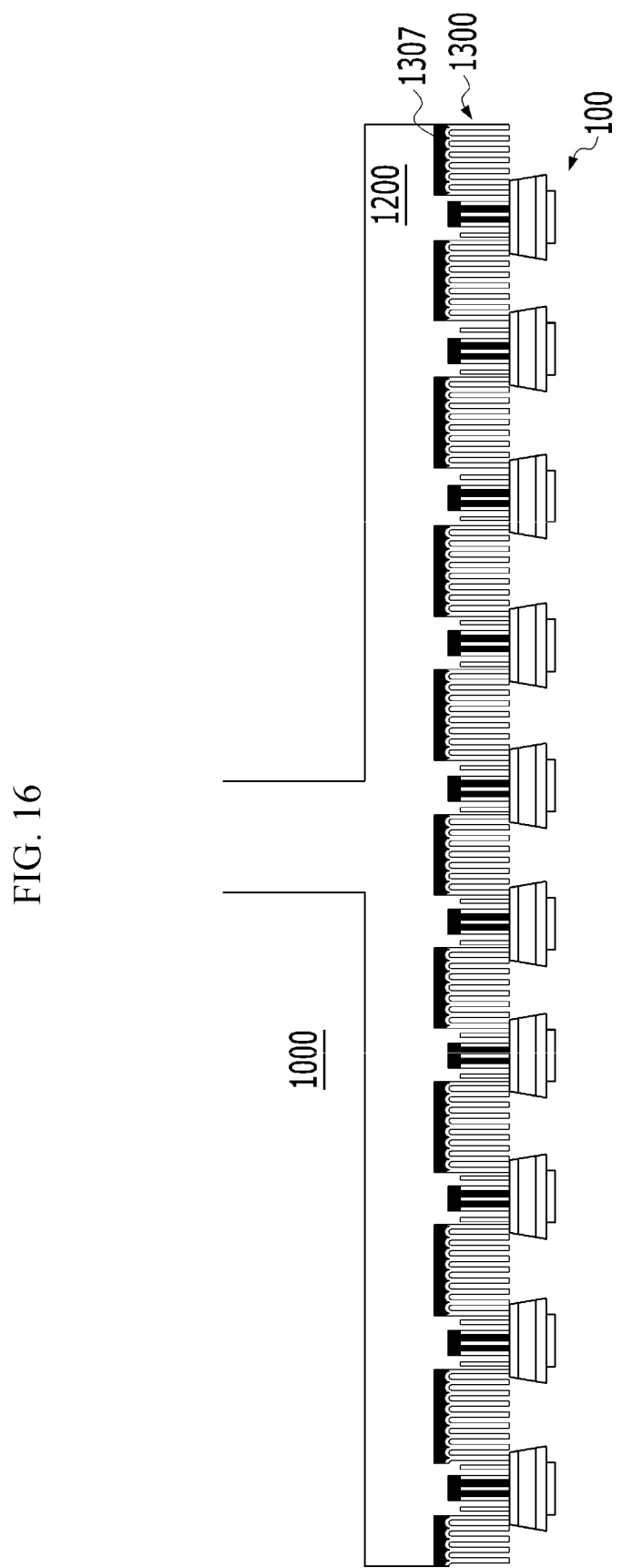
FIGS. 16 and 17 are views each illustrating a modification of the fifth embodiment.

FIG. 16 is view illustrating a modification of the micro LED grip body 1000 illustrated in FIG. 14. The micro LED grip body 1000 illustrated in FIG. 16 is configured such that a supporting portion 1307 is further provided on the non-suction region 1330 to reinforce the strength of the anodic oxide film 1300. For example, the supporting portion 1307 may be made of a metal base material. The metal base material used for the anodization is not removed and left on the barrier layer 1301 such that the metal base material (e.g., aluminum or an aluminum alloy) may serve as the supporting portion 1307. Referring to FIG. 16, the non-suction region 1330 is configured with the supporting portion 1307 made of the metal, the barrier layer 1301, and the porous layer 1305 having the pores 1303. As the supporting portion 1307 made of the metal and the barrier layer 1301 are removed, the suction region 1310 is formed in a manner that the upper and lower portions of the pores 1303 extend from top to bottom. The supporting portion 1307 made of the metal is provided in the non-suction region 1330 to secure the strength of the anodic oxide film 1300. As the strength of the anodic oxide film 1300 which has a relatively weak strength is increased due to the above-described configuration of the supporting portion 1307, it is possible to configure the micro LED grip body 1000 having the anodic oxide film 1300 to have a large area.

Figure 17:
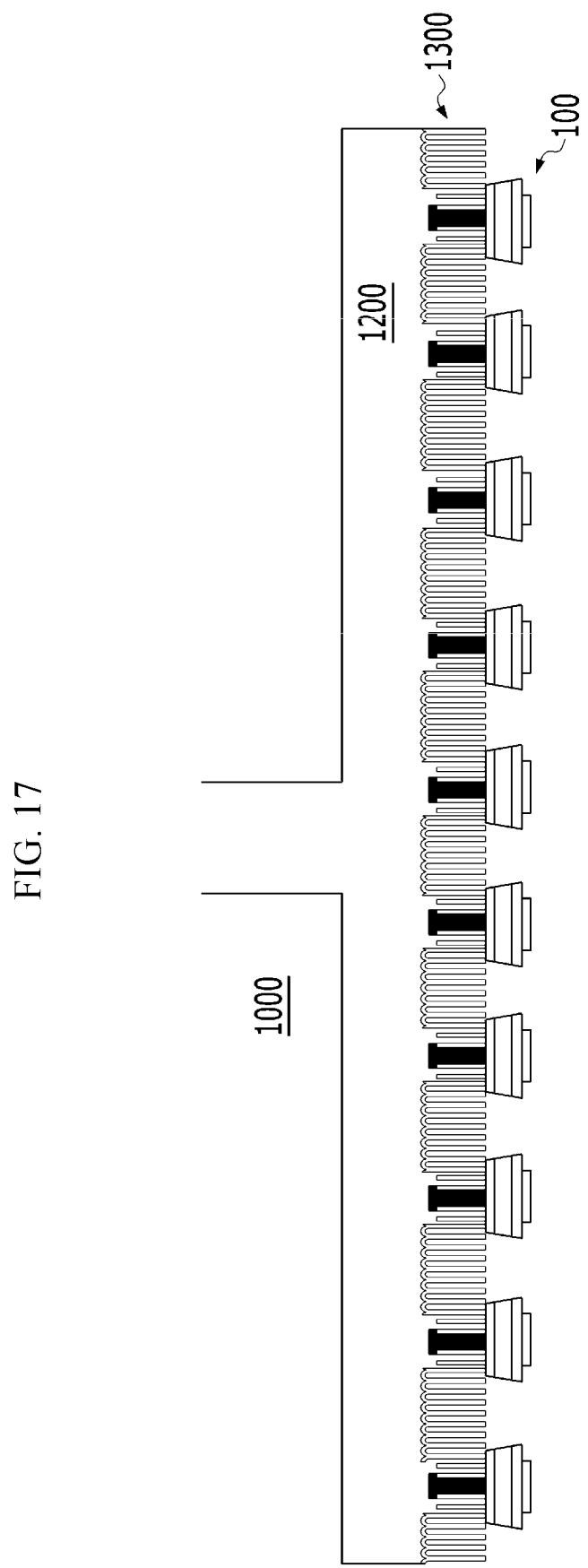

FIG. 17 is a view illustrating a modification of the micro LED grip body 1000 illustrated in FIG. 14. The micro LED grip body 1000 illustrated in FIG. 17 is configured such that a through-hole 1309 is further provided in the suction region 1310 of the anodic oxide film 1300 in addition to the pores 1303 which are formed spontaneously in the anodic oxide film 1300. The through-hole 1309 is configured to extend from top to bottom of the anodic oxide film 1300 longitudinally. A diameter of the through-hole 1309 is configured to be larger than those of the pores 1303. The through-hole 1309 may be formed by etching the anodic oxide film 1300 vertically after forming the anodic oxide film 1300 and the pores 1303. By using the etching method for forming the through-hole 1309, it is possible to form the through-hole 1309 stably compared with simply forming the through-hole 1309 by reaming the pores 1303. In other words, when forming the through-hole 1309 by reaming the pores 1303, side surfaces of the pores 1303 are collapsed, leading to damage to the through-hole 1309, for example, a deformation of the through-hole 1309. However, by forming the through-hole 1309 by etching, the through-hole 1309 is easily formed without damaging the side surfaces of the pores 1303, thereby preventing damage to the through-hole 1309. It is possible to more easily form the vertical conductive portion 1351 by using the through-hole 1309 and to broaden the contact area between the micro LED 100 and the vertical conductive portion 1351.

Sixth Embodiment

Hereinafter, a sixth embodiment of the present invention will be described. It should be noted that the embodiment described below will be described with particular emphasis on characteristic components as compared with the fifth embodiment, and descriptions of the same or similar components as those of the fifth embodiment will be omitted.

Figure 18:
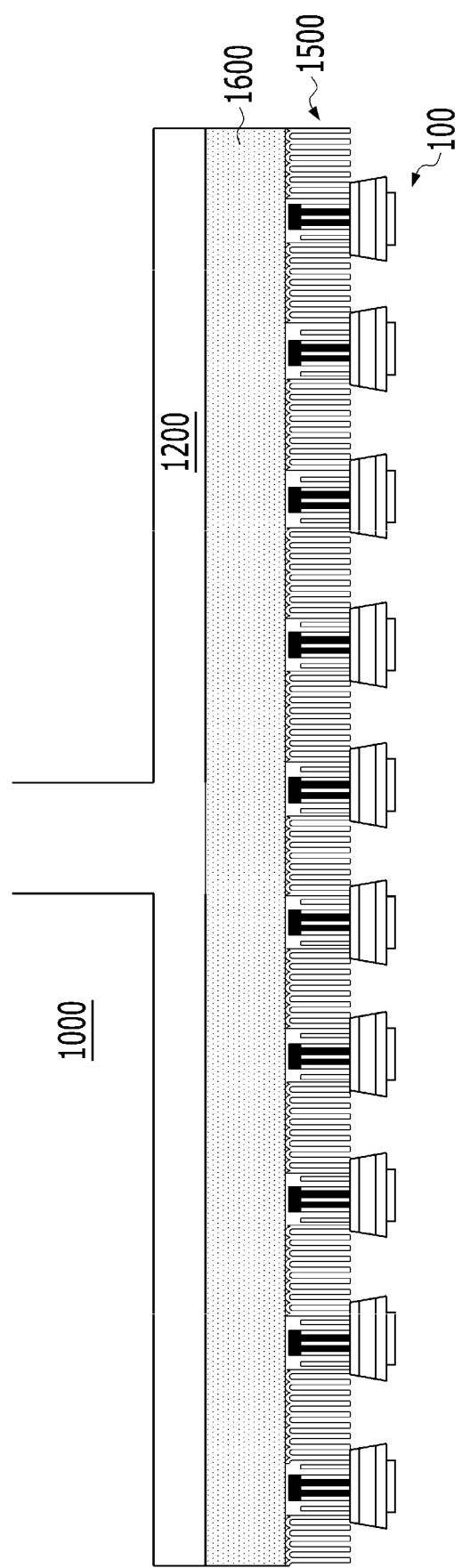
FIG. 18 is a view illustrating a micro LED grip body according to a sixth embodiment of the present invention.

FIG. 18 is a view illustrating a micro LED grip body 1000 according to a sixth embodiment of the present invention.

The micro LED grip body 1000 according to the sixth embodiment is configured to have two porous members including a first porous member 1500 and a second porous member 1600. The second porous member 1600 is provided on the first porous member 1500.

The first porous member 1500 functions to vacuum-suck the micro LEDs 100. The second porous member 1600 is disposed between a vacuum chamber 1200 and the first porous member 1500 to transfer the vacuum pressure of the vacuum chamber 1200 to the first porous member 1500.

The first porous member 1500 is embodied by an anodic oxide film having pores formed by anodizing a metal. The first porous member 1500 may be embodied by the configuration of the fifth embodiment described above and a modification thereof.

The second porous member 1600 may be embodied by a porous scaffold functioning to support the first porous member 1500. A material of the second porous member 1600 is not limited as long as the second porous member 1600 made of the material functions to support the first porous member 1500. The second porous member 1600 may have the above-mentioned configuration of the porous member 1100 of the fifth embodiment.

The second porous member 1600 may be embodied by a rigid porous scaffold capable of preventing sagging at the center portion of the first porous member 1500.

For example, the second porous member 1600 may be made of a porous ceramic material.

In the case the second porous member 1600 is made of a porous ceramic material, a size of pores is non-uniform and the pores are formed in various directions, so that the vacuum pressure may be supplied non-uniformly depending on the location. On the other hand, pores of an anodic oxide film are uniform in size and the pores are formed in one direction (for example, a vertical direction) such that the vacuum pressure is supplied uniformly even when the location varies.

Therefore, as described above, in the case the first porous member 1500 is embodied by the anodic oxide film having pores and the second porous member 1600 is embodied by the porous ceramic material, it is possible to maintain the porosity of the micro LED grip body 1000, secure the strength of the micro LED grip body 1000, and secure the uniformity of the vacuum pressure.

Seventh Embodiment

Hereinafter, a seventh embodiment of the present invention will be described. It should be noted that the embodiment described below will be described with particular emphasis on characteristic components as compared with the fifth embodiment, and descriptions of the same or similar components as those of the fifth embodiment will be omitted.

Figure 19:
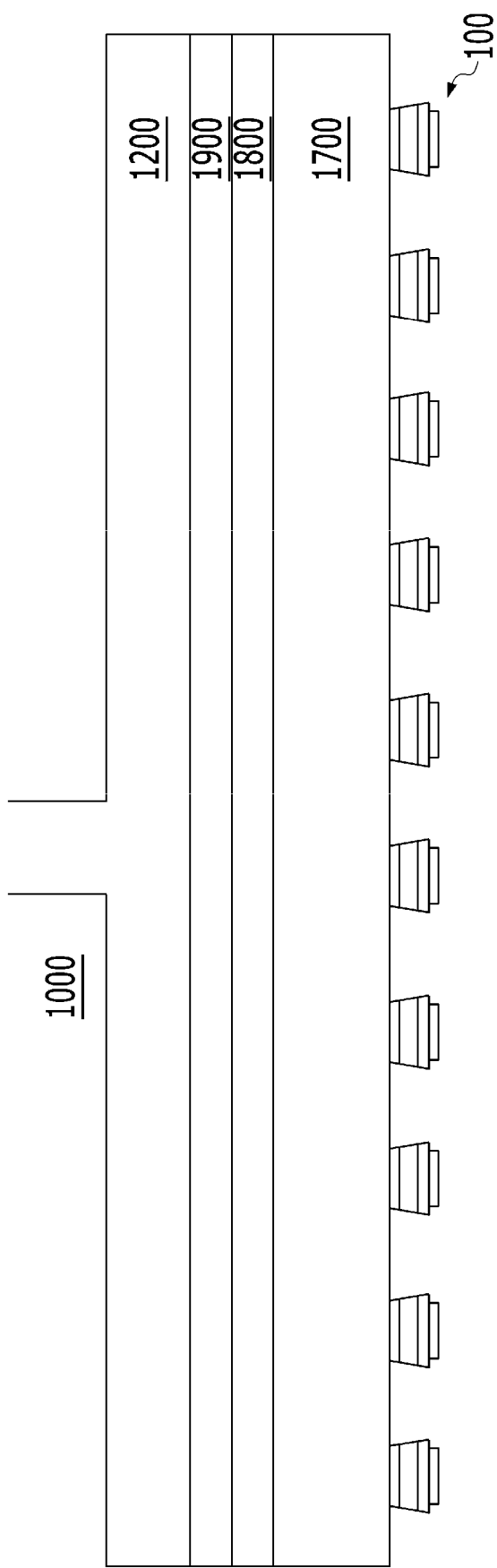
FIG. 19 is a view illustrating a micro LED grip body according to a seventh embodiment of the present invention.

FIG. 19 is a view illustrating a micro LED grip body 1000 according to a seventh embodiment of the present invention.

The micro LED grip body 1000 according to the seventh embodiment is configured to have three porous members including a first porous member 1700, a second porous member 1800, and a third porous member 1900.

The second porous member 1800 is provided on the first porous member 1700, and the third porous member 1900 is provided on the second porous member 1800. The first porous member 1700 functions to vacuum-suck the micro LEDs 100. At least one of the second porous member 1800 and the third porous member 1900 may be embodied by a rigid porous scaffold, and the remaining one of the second porous member 1800 and the third porous member 1900 may be embodied by a soft porous buffer.

The first porous member 1700 may be embodied by the fifth embodiment and the modification thereof. The second porous member 1800 may be embodied by a rigid porous scaffold (e.g., porous ceramic material) capable of preventing sagging at the center portion of the first porous member 1500. The third porous member 1900 may be embodied by a soft porous buffer (e.g., a porous material having a high elasticity, such as a sponge material).

With the above structure, it is possible to provide uniform vacuum pressure applied to the micro LEDs 100, prevent the sagging at the center portion of the first porous member 1700, and prevent damage to the micro LEDs 100.

A system having a micro LED grip body for inspecting micro LEDs according to an embodiment of the present invention includes: a micro LED grip body including a porous member having pores, a vertical conductive layer provided in the pores of the porous member, a horizontal conductive portion connected with the vertical conductive portion, and a first conductive layer provided on a surface of the porous member; and an inspection device having a second conductive layer on a surface thereof, wherein the micro LEDs are positioned between the first conductive layer of the micro LED grip body and the second conductive layer of the inspection device to inspect the micro LEDs.

A system having a micro LED grip body for inspecting micro LEDs according to an embodiment of the present invention will be described with reference to FIGS. 20 and 21.

FIG. 20 is a view illustrating the micro LEDs 100 transferred from the first substrate 101 to the second substrate 300 by a micro LED grip body embodied by a transfer head 1000 according to any one of the fifth to seventh embodiments of the present invention.

Referring to FIG. 20, the transfer head 1000 descends to grip the micro LEDs 100 on the first substrate 101 and moves to the second substrate 300. During the movement of the transfer head 1000, an inspection device 3000 is positioned below the transfer head 1000. The inspection device 3000 has a second conductive layer on a surface thereof, and the transfer head 1000 has a vertical conductive portion 1351 on a surface thereof. When the second conductive layer of the inspection device 3000 and the micro LEDs 100 are brought into contact with each other, it is possible to inspect the micro LEDs 100 by flowing electricity to the terminals (the first and second contact electrodes 106 and 107) provided on the upper and lower sides of the micro LEDs 100. In other words, the micro LEDs 100 are positioned between the vertical conductive portion 1351 of the transfer head 1000 and the second conductive layer of the inspection device to check whether the micro LEDs 100 are defective.

Figure 21:
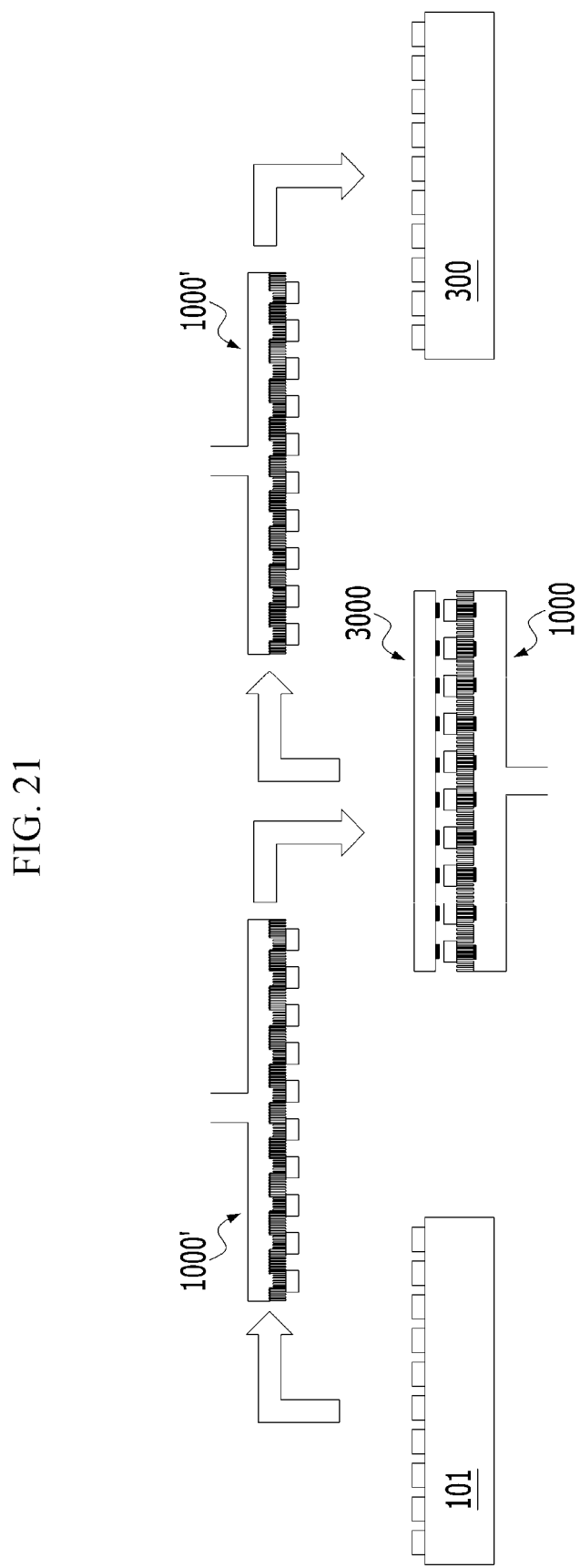
FIG. 21 is a view illustrating micro LEDs inspected by a micro LED grip body embodied by a temporary support substrate according to any one of the fifth to seventh embodiments of the present invention.

FIG. 21 is a view illustrating the micro LED grip body according to any one of the fifth to seventh embodiments of the present invention, which is embodied by a temporary support substrate 4000 and receives the micro LEDs 100 from the transfer head 1000'. Here, the transfer head 1000' is a transfer mechanism that grips and transfers the micro LEDs 100 by a grip force, wherein the grip force may include an electrostatic force, an electromagnetic force, a suction force, and the like.

Referring to FIG. 21, the transfer head 1000' grips the micro LEDs 100 on the first substrate 101 and transfers the micro LEDs 100 to the temporary support substrate 4000. The temporary supporting substrate 4000 applies a suction force to the pores to grip the micro LEDs 100. While the temporary support substrate 4000 grips the micro LEDs 100, the inspection device 3000 moves above the temporary support substrate 4000. The inspection device 3000 has a second conductive layer on a surface thereof, and the temporary support substrate 4000 has a vertical conductive portion 1351 on a surface thereof. It is possible to inspect the micro LEDs 100 by flowing electricity to the terminals (the first and second contact electrodes 106 and 107) provided on the upper and lower sides of the micro LEDs 100. In other words, the micro LEDs 100 are positioned between the vertical conductive portion 1351 of the temporary support substrate 4000 and the second conductive layer of the inspection device to check whether the micro LEDs 100 are defective.

As described above, the present invention has been described with reference to the embodiments. However, those skilled in the art will appreciate that various modifications, additions and substitutions are possible, without departing from the scope and spirit of the invention as disclosed in the accompanying claims.

What is claimed:

1. A micro LED grip body, comprising:
a porous member including an anodic oxide film having pores; and
a conductive layer provided on a surface of the porous member to prevent a generation of static electricity on the surface of the porous member,
wherein the porous member includes a suction region gripping micro LEDs and a non-suction region not gripping the micro LEDs, and
wherein the pores comprise first pores and second pores, the first pores are located in the suction region, the second pores are located in the non-suction region, and the first pores are configured to extend from top to bottom of the porous member.

2. The micro LED grip body of claim 1, wherein the conductive layer is configured in a manner not to block the pores.

3. The micro LED grip body of claim 1, wherein a micro LED brought into close contact with a surface of the conductive layer is gripped by a transfer head due to vacuum applied to the pores.

4. A micro LED grip body, comprising:
a porous member having pores; and
a conductive layer provided on a surface of the porous member to prevent a generation of static electricity on the surface of the porous member,
wherein the porous member includes a suction region with a through-hole gripping micro LEDs and a non-suction region not gripping the micro LEDs, and
wherein the through-hole is configured to extend from top to bottom of the porous member, and a diameter of the through-hole is configured to be larger than those of the pores.

5. The micro LED grip body of claim 1, wherein the porous member includes a porous ceramic.

6. A micro LED grip body, comprising:
a porous member having pores, the pores comprising first pores and second pores;
a vertical conductive portion provided in some of the first pores of the porous member; and
a horizontal conductive portion connected with the vertical conductive portion,
wherein the porous member includes a suction region gripping micro LEDs and a non-suction region not gripping the micro LEDs, and
wherein the first pores are located in the suction region, the second pores are located in the non-suction region, and the first pores extend from top to bottom of the porous member.

7. The micro LED grip body of claim 6, wherein the vertical conductive portion is provided in the suction region.

8. The micro LED grip body of claim 6, wherein the porous member is configured as an anodic oxide film formed by anodizing a metal.

\* \* \* \* \*